United States Patent
Singh et al.

(10) Patent No.: US 12,308,210 B2
(45) Date of Patent: *May 20, 2025

(54) ACTIVE SWITCH ON TIME CONTROL FOR BIAS SUPPLY

(71) Applicant: Advanced Energy Industries, Inc., Denver, CO (US)

(72) Inventors: Maneesh Kumar Singh, Fort Collins, CO (US); Hien Minh Nguyen, Longmont, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/742,088

(22) Filed: Jun. 13, 2024

(65) Prior Publication Data

US 2025/0022683 A1 Jan. 16, 2025

Related U.S. Application Data

(63) Continuation of application No. 17/584,992, filed on Jan. 26, 2022, now Pat. No. 12,046,448.

(51) Int. Cl.
*H02M 7/537* (2006.01)
*H01J 37/32* (2006.01)
(Continued)

(52) U.S. Cl.
CPC ......... *H01J 37/32146* (2013.01); *H02M 1/08* (2013.01); *H02M 3/155* (2013.01); *H02M 7/537* (2013.01); *H02M 7/5395* (2013.01)

(58) Field of Classification Search
CPC .............. H02M 7/5395; H02M 7/537; H02J 37/32146; H02J 37/32128;
(Continued)

(56) References Cited

U.S. PATENT DOCUMENTS 11,670,487 B1 6/2023 Nguyen
11,887,812 B2 1/2024 Nguyen et al.
(Continued)

FOREIGN PATENT DOCUMENTS

CN 206272512 U 6/2017
WO 2010008006 A1 1/2010

OTHER PUBLICATIONS

EPO, Extended European Search Report issued in Application No. 21803110.2, Jun. 6, 2024, pp. 11.
(Continued)

*Primary Examiner* — Jue Zhang
*Assistant Examiner* — Jye-June Lee
(74) *Attorney, Agent, or Firm* — NOD Law PC

(57) ABSTRACT

Bias supplies and plasma processing systems are disclosed. One bias supply comprises an output node, a return node, and a switch network and at least one power supply coupled to the output node and the return node. The switch network and the at least one power supply configured, in combination, to apply an asymmetric periodic voltage waveform and provide a corresponding current waveform at the output node relative to the return node. A timing parameter estimator receives a digital representation of a full cycle of the voltage and current waveforms, and generates a pulse width control signal based on a crossing time that the current waveform crosses a threshold current value after falling from a positive peak current value to control the switch network.

20 Claims, 23 Drawing Sheets

(51) Int. Cl.
*H02M 1/08* (2006.01)
*H02M 3/155* (2006.01)
*H02M 7/5395* (2006.01)

(58) Field of Classification Search
CPC ........... H02J 37/32174; H02J 37/32706; H02J 37/32082; H03K 3/57
See application file for complete search history.

(56) References Cited

U.S. PATENT DOCUMENTS

| | | | |
|---|---|---|---|
| 11,942,309 B2 | 3/2024 | Singh | |
| 11,978,613 B2 | 5/2024 | Nguyen | |
| 12,009,179 B2 | 6/2024 | Nguyen | |
| 12,046,448 B2 | 7/2024 | Singh et al. | |
| 12,125,674 B2 | 10/2024 | Carter | |
| 2010/0244802 A1 | 9/2010 | Alexander | |
| 2013/0083566 A1 | 4/2013 | Gaknoki et al. | |
| 2014/0117872 A1 | 5/2014 | Finley | |
| 2015/0222181 A1 | 8/2015 | Coleman | |
| 2017/0358431 A1 | 12/2017 | Dorf et al. | |
| 2018/0166249 A1 | 6/2018 | Dorf et al. | |
| 2020/0357607 A1 | 11/2020 | Ziemba et al. | |
| 2021/0013006 A1* | 1/2021 | Nguyen | H01J 37/32128 |
| 2022/0037121 A1 | 2/2022 | Dorf et al. | |
| 2022/0415615 A1 | 12/2022 | Cubaynes et al. | |
| 2023/0050841 A1* | 2/2023 | Nguyen | H01J 37/32174 |
| 2023/0238216 A1 | 7/2023 | Singh et al. | |
| 2023/0253187 A1 | 8/2023 | Singh | |
| 2023/0343556 A1 | 10/2023 | Nguyen | |
| 2023/0395354 A1* | 12/2023 | Shaw | H01J 37/32412 |
| 2024/0030001 A1 | 1/2024 | Nguyen et al. | |
| 2024/0079210 A1 | 3/2024 | Nguyen | |
| 2024/0194452 A1 | 6/2024 | Singh | |
| 2024/0242945 A1 | 7/2024 | Nguyen et al. | |
| 2024/0304419 A1 | 9/2024 | Nguyen | |

OTHER PUBLICATIONS

JPO, Notice of Reasons for Rejection issued in Application No. 2022-501232, May 29, 2024, 10 pages, Published in JP.
PCT, International Preliminary Report on Patentability issued in PCT/US2022/053703, Aug. 8, 2024, 7 pages.
PCT, International Preliminary Report on Patentability issued in PCT/US2022/053706, Aug. 8, 2024, 8 pages.
PCT, International Preliminary Report on Patentability issued in PCT/US2022/053709, Aug. 8, 2024, 7 pages.
PCT, International Search Report and Written Opinion issued in PCT/US2024/044334, Jun. 21, 2024, 16 pages.
TIPO, Office Action issued in Application No. 109123604, Jun. 24, 2024, 26 pages, Published in Taiwan.
Yu, Yuechuan, Office Action issued in U.S. Appl. No. 18/318,861, Mar. 20, 2024, 51 pages, Published in US.
Japan Patent Office, Notice of Reasons for Rejection issued in JP Application No. 2022-568414, Oct. 10, 2024.
PCT, International Search Report and Written Opinion issued PCT/US2023/073153, Feb. 9, 2024, 18 pages.
Skibinski, Tomi Sweet, Non-final Office Action issued in U.S. Appl. No. 18/656,543, Nov. 15, 2024, 21 pages.
Yu, Yuechuan, Final Office Action issued in U.S. Appl. No. 18/318,861, Nov. 12, 2024, 95 pages.
PCT, International Preliminary Report on Patentability issued in PCT/US2023/073153, Mar. 13, 2025, 9 pages.
PCT, International Search Report and Written Opinion issued in PCT/US2024/055362, Jan. 14, 2025, 18 pages.
Yu, Yuechuan, Office Action issued in U.S. Appl. No. 18/318,861, Feb. 20, 2025, 102 pages.

* cited by examiner

ACTIVE SWITCH ON TIME CONTROL FOR BIAS SUPPLY

CLAIM OF PRIORITY UNDER 35 U.S.C. § 120

The present Application for Patent is a continuation of U.S. patent application Ser. No. 17/584,992 entitled "ACTIVE SWITCH ON TIME CONTROL FOR BIAS SUPPLY" filed Jan. 26, 2022 and assigned to the assignee hereof and hereby expressly incorporated by reference herein.

BACKGROUND

Field

The present invention relates generally to power supplies, and more specifically to power supplies for applying a voltage for plasma processing.

Background

Many types of semiconductor devices are fabricated using plasma-based etching techniques. If it is a conductor that is etched, a negative voltage with respect to ground may be applied to the conductive substrate so as to create a substantially uniform negative voltage across the surface of the substrate conductor, which attracts positively charged ions toward the conductor, and as a consequence, the positive ions that impact the conductor have substantially the same energy.

If the substrate is a dielectric, however, a non-varying voltage is ineffective to place a voltage across the surface of the substrate. But an alternating current (AC) voltage (e.g., high frequency AC or radio frequency (RF)) may be applied to the conductive plate (or chuck) so that the AC field induces a voltage on the surface of the substrate. During a negative portion of the applied waveform, the surface of the substrate will be charged negatively, which causes ions to be attracted toward the negatively-charged surface during the negative portion of the AC cycle. And when the ions impact the surface of the substrate, the impact dislodges material from the surface of the substrate—effectuating the etching.

In many instances, it is desirable to have a narrow (or specifically tailorable) ion energy distribution but applying a sinusoidal waveform to the substrate induces a broad distribution of ion energies, which limits the ability of the plasma process to carry out a desired etch profile. Known techniques to achieve a narrow (or specifically tailorable) ion energy distribution are expensive, inefficient, difficult to control, and/or may adversely affect the plasma density. As a consequence, many of these known techniques have not been commercially adopted. Accordingly, a system and method are needed to address the shortfalls of present technology and to provide other new and innovative features.

SUMMARY

An aspect may be characterized as a bias supply to apply a periodic voltage. The bias supply comprises a switch network and at least one power supply coupled to an output node and a return node. The switch network and the at least one power supply are configured, in combination, to apply an asymmetric periodic voltage waveform and a corresponding current waveform at the output node relative to the return node. A timing parameter estimator is configured to receive a digital representation of a full cycle of the asymmetric periodic voltage waveform and the current waveform and to generate a pulse width control signal based on a first crossing time that the current waveform crosses a threshold current value after falling from a positive peak current value. A gate drive signal generator is configured to, responsive to the pulse width control signal received from the timing parameter estimator, provide a gate drive signal to at least one switch of the switch network to control application of the asymmetric periodic voltage waveform and the current waveform to the output node relative to the return node.

Yet another aspect may be characterized as a method for applying a periodic voltage. The method comprises applying an asymmetric periodic voltage waveform and providing a corresponding current waveform at an output node relative to a return node of a bias supply. Digital representations of the asymmetric periodic voltage waveform and the current waveform are received, and a pulse width control signal is generated based on a first crossing time that the current waveform crosses a threshold current value after falling from a positive peak current value. A gate drive signal is provided, responsive to the pulse width control signal, to at least one switch of a switch network to control application of the asymmetric periodic voltage waveform.

Another aspect disclosed herein is a bias supply to apply a periodic voltage comprising an output node, a return node, and means for applying an asymmetric periodic voltage waveform and a corresponding current waveform at the output node relative to the return node. The bias supply also comprises a processor and non-volatile memory, the non-volatile memory comprising non-transient, processor executable instructions, the instructions comprising instructions to receive a digital representation of a full cycle of the asymmetric periodic voltage waveform and the current waveform and generate a pulse width control signal based on a first crossing time that the current waveform crosses a threshold current value after falling from a positive peak current value. In addition, the bias supply comprises a gate drive signal generator configured to, responsive to the pulse width control signal received from the timing parameter estimator, provide a gate drive signal to at least one switch of the switch network to control application of the asymmetric periodic voltage waveform and the current waveform to the output node relative to the return node.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

For the purposes of this disclosure, source generators are those whose energy is primarily directed to generating and sustaining the plasma, while "bias supplies" are those whose energy is primarily directed to generating a surface potential for attracting ions and electrons from the plasma.

Figure 1:
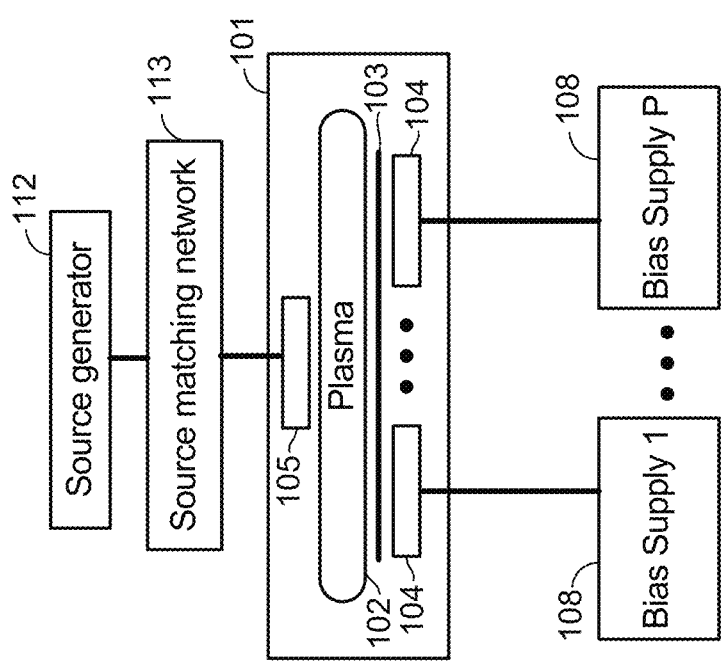
FIG. 1 is a block diagram depicting an exemplary plasma processing environment in which bias supplies disclosed herein may be utilized.

Described herein are control aspects of bias supplies that may be used to apply a periodic voltage function to a substrate support in a plasma processing chamber. Referring first to FIG. 1, shown is an exemplary plasma processing environment (e.g., deposition or etch system) in which bias supplies may be utilized. The plasma processing environment may include many pieces of equipment coupled directly and indirectly to a plasma processing chamber 101, within which a volume containing a plasma 102 and workpiece 103 (e.g., a wafer) and electrodes 104 (which may be embedded in a substrate support) are contained. The equipment may include vacuum handling and gas delivery equipment (not shown), one or more bias supplies 108, one or more source generators 112, and one or more source matching networks 113. In many applications, power from a single source generator 112 is connected to one or multiple source electrodes 105. The source generator 112 may be a higher frequency RF generator (e.g., 13.56 MHz to 120 MHz). The electrode 105 generically represents what may be implemented with an inductively coupled plasma (ICP) source, a dual capacitively-coupled plasma source (CCP) having a secondary top electrode biased at another RF frequency, a helicon plasma source, a microwave plasma source, a magnetron, or some other independently operated source of plasma energy.

In variations of the system depicted in FIG. 1, the source generator 112 and source matching network 113 may be replaced by, or augmented with, a remote plasma source. Other variations of the system may include only a single bias supply 108. It should be recognized that many other variations of the plasma processing environment depicted in FIG. 1 may be utilized. As examples without limitation, U.S. Pat. No. 10,707,055, issued Jul. 7, 2020 and U.S. Pat. No. 10,811,227, issued Oct. 20, 2020, both of which are incorporated by reference in their entirety, disclose various types of system designs.

It should also be recognized that, while the following disclosure generally refers to plasma-based wafer processing, implementations can include any substrate processing within a plasma chamber. In some instances, objects other than a substrate can be processed using the systems, methods, and apparatus herein disclosed. In other words, this disclosure applies to plasma processing of any object within a sub-atmospheric plasma processing chamber to affect a surface change, subsurface change, deposition, or removal by physical or chemical means.

Figure 2:
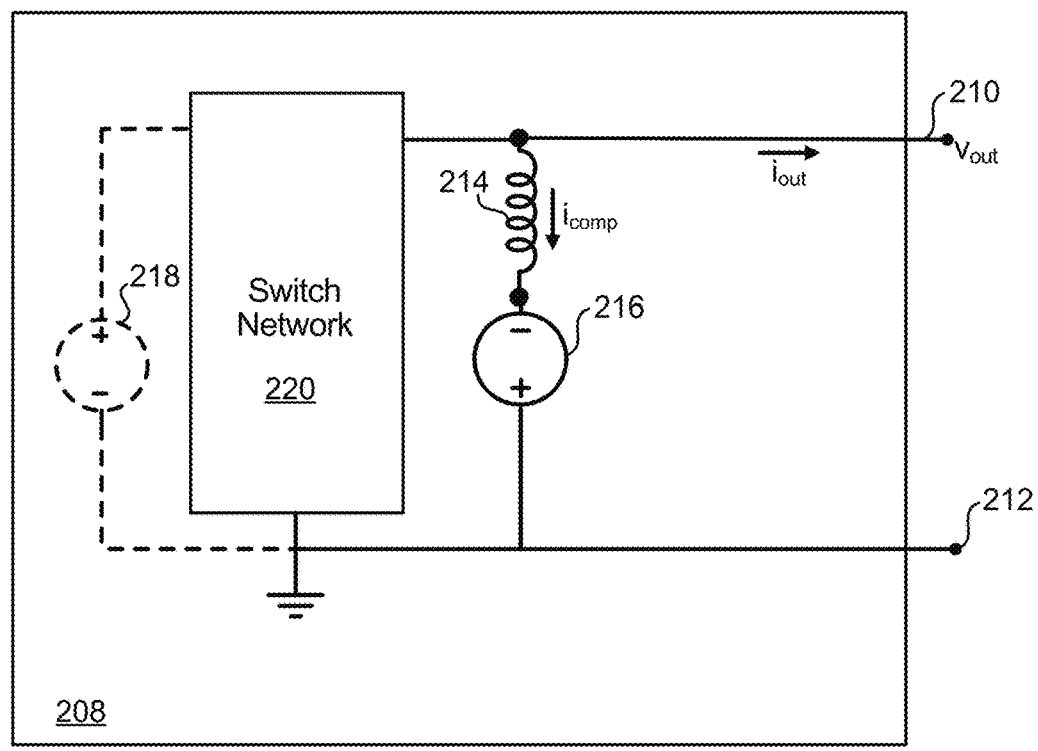
FIG. 2 is a schematic diagram depicting an exemplary bias supply.

Referring to FIG. 2, shown is an exemplary bias supply 208 that may be utilized to implement the bias supplies 108 described with reference to FIG. 1. The bias supply 208 generally represents many variations of bias supplies described further herein to apply a periodic voltage function. Thus, reference to the bias supply 208 generally refers to any of the bias supplies described further herein. As shown, the bias supply 208 includes an output 210 (also referred to as an output node 210), a return node 212, a switch network 220, and a series combination of an inductance 214 and a first power supply 216 (also referred to herein as $V_{supply}$) that is coupled between the output node 210 and the return node 212. Also shown is an optional second power supply 218 (also referred to herein as $V_{rail}$). In general, the bias supply 208 functions to apply an asymmetric periodic voltage function $V_{out}$ between the output node 210 and the return node 212. Current delivered to a load through the output node 210 is returned to the bias supply 208 through the return node 212 that may be common with the load.

Although not depicted in FIG. 2 for clarity and simplicity, the bias supply 208 may be coupled to a controller and/or include a controller that is coupled to the switch network 220. Variations of the switch network 220 (and variations with and without the second power supply 218) are disclosed further herein, but first, it is helpful to understand aspects of a plasma load.

Figure 3:
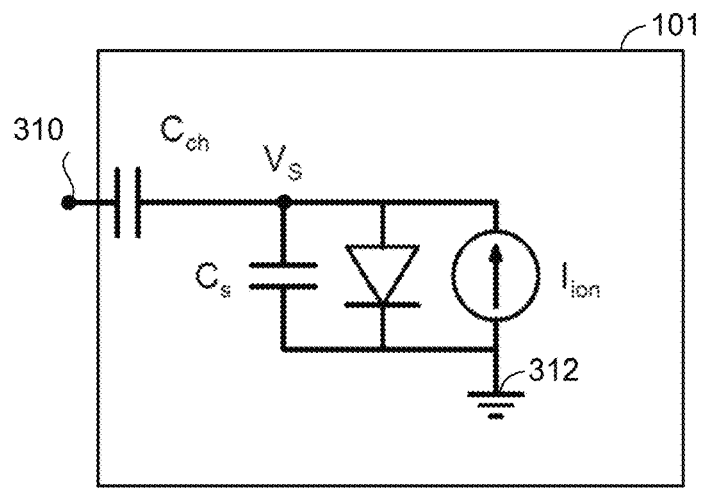
FIG. 3 is a schematic diagram electrically representing aspects of a plasma processing chamber.

Referring briefly to FIG. 3, shown is a schematic drawing that electrically depicts aspects of an exemplary plasma load within the plasma processing chamber 101. As shown, the plasma processing chamber 101 may be represented by a chuck capacitance $C_{ch}$ (that includes a capacitance of a chuck and workpiece 103) that is positioned between an input 310 (also referred to as an input node 310) to the plasma processing chamber 101 and a node representing a sheath voltage $V_s$ at a surface of the workpiece 103 (also referred to as a wafer substrate 103). Therefore, references to the sheath voltage $V_s$ are also referred to herein as a voltage at a surface of the wafer or substrate. In addition, a return node 312 (which may be a connection to ground) is depicted. The plasma 102 in the processing chamber is represented by a parallel combination of a sheath capacitance $C_s$, a diode, and a current source. The diode represents the non-linear, diode-like nature of the plasma sheath that results in rectification of the applied AC field, such that a direct-current (DC) voltage drop, appears between the workpiece 103 and the plasma 102.

Figure 4:
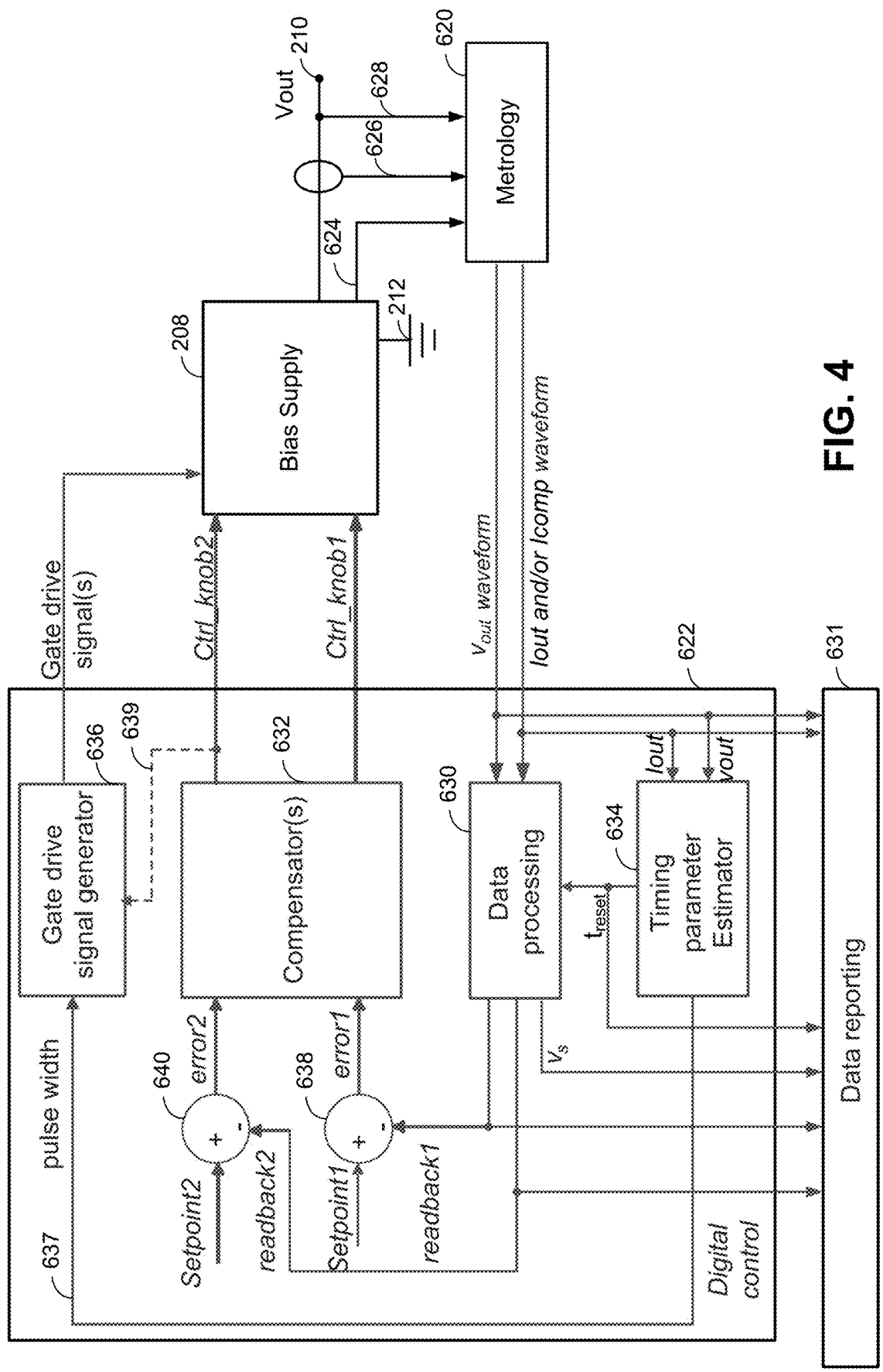
FIG. 4 is a block diagram depicting aspects of sampling, readback, and control of a bias supply.

Referring next to FIG. 4, shown is a block diagram depicting general aspects of metrology, readback and control. Shown are the bias supply 208, a metrology section 620 and a digital control section 622. In general, the metrology section 620 receives signals indicative of power-related parameter values and provides a digital representation of the power-related parameter values to the digital control section 622. For example, the power related parameters may be the output current Iout provided to the output node 210 and the voltage $V_{out}$ between the output node 210 and the return node 212. Although not required, the return node may be a ground connection.

The metrology section 620 may receive signals from one or more bias supply signal lines 624. The bias supply signal lines 624 may convey signals indicative of bias supply parameters such as the compensation current $I_{comp}$, temperature, and other parameters within the bias supply 208. A current signal line 626 may provide analog signals from a current transducer that are indicative of current provided to the output node 210, and a voltage line 628 may provide analog signals that are indicative of the voltage $V_{out}$ at the output of the bias supply. In response to receiving the power-related signals, the metrology section 620 samples and digitizes the power-related signals. For example, the metrology section 620 may provide complete digital representations of the asymmetrical periodic voltage waveform $V_{out}$, the output current waveform $i_{out}$, and/or the compensation current $I_{comp}$.

An aspect of many variations of the metrology section 620 is that the complete voltage and current waveforms are captured, which provides enhanced visibility of the output of the bias supply and enables improved control aspects disclosed further herein.

Although not required, the metrology section 620 may be realized in part by a field programmable gate array, and the digital control section 622 may be realized by one or more processors that execute code stored in non-transitory media (to effectuate the functions of the digital control section 622). Other combinations of hardware, software, and firmware may be used to realize the metrology section 620 and the digital control section 622.

As shown, the digital representations of the asymmetrical periodic voltage waveform $V_{out}$, the output current waveform $i_{out}$, and/or $i_{comp}$ may be provided to a data reporting component 631, which may be a user interface (e.g., a touchscreen display). In addition, the digital representations of the asymmetrical periodic voltage waveform $V_{out}$, the output current $i_{out}$ and/or the compensation current $i_{comp}$ are provided to a data processing module 630, which may further process the digital representations of the asymmetrical periodic voltage waveform $V_{out}$, the output current waveform $i_{out}$ and/or the compensation current $i_{comp}$ to provide readback of one or more of sheath voltage $v_s$, and one or more other parameter values such as $E_{ion}$, $V_{step}$, $\Delta E_{ion}$, output voltage slope (e.g., the slope of the third portion of the asymmetrical periodic voltage waveform), and/or a slope deviation factor, Ks.

The slope deviation factor, Ks, may be calculated as:

$$K_S = \frac{C_{chuck}}{C_{chuck} + C_{stray1}} \times \frac{\text{Slope}_w}{\text{Slope}}$$

where slope$_w$ is the slope from t3 to t4 of the wafer/sheath voltage.

Or in the alternative, the slope deviation factor may be calculated to satisfy the following equation:

$$(1 - K_S)\left(1 + \frac{C_{stray1}}{C_{chuck}}\right) \cdot \text{Slope} + \frac{I_o}{C_{chuck}} = 0$$

The slope deviation factor, Ks, provides a convenient representation of a level of compensation current $I_{comp}$ relative to the ion current $I_{ion}$. For example, when Ks is equal to zero, the compensation current is providing a full compensation; when Ks>0, $I_{comp}$ is overcompensating for the ion current, and when Ks<0, the compensation current $I_{comp}$ is undercompensating for the ion current $I_{ion}$.

As shown, the readback values (depicted for example as readback 1 and readback 2) may also be used as part of feedback control. A first comparator 638 may calculate a difference between a first setpoint, setpoint1, and a first readback value, readback1, to produce a first error signal, error1. A second comparator 640 may calculate a difference between a second setpoint, setpoint2, and a second readback value, readback2, to produce a second error signal error2. The error signals (error1 and error 2) may be fed to one or more compensators 632, and the one or more compensators 632 may provide control signals (Ctrl_knob1 and Ctrl_knob2) to the bias supply 208 as described further herein.

Also shown within the digital control section 622 is a timing parameter estimator 634, which may receive the digital representations of the output voltage waveform $V_{out}$ and the output current waveform $i_{out}$ and produce a pulse width control signal. According to an aspect, the timing parameter estimator 634 detects when there is zero current through switches of the bias supply and sets the pulse width to cause the switches to open (turn off) at or after that time, in order to reduce switching-related losses; thus, the on time for the switches is also controlled. The timing parameter estimator 634 may also determine $t_{reset}$ (shown in FIGS. 4 and 5), and the value for $t_{reset}$ may be reported via the data reporting component 631 and provided to the data processing module 630. Timing parameter estimator 634 may be realized by one or more processors that execute code stored in non-transitory media, and/or other combinations of hardware, software, and firmware.

The digital control section 622 also comprises a gate drive signal generator 636 that is configured to provide gate drive signals to the switches S1 and S2 of the bias supply 208 (to control the time the switches S1 and S2 are on and off) responsive to the pulse width control signal 637 from the timing parameter estimator 634 and/or responsive to a control signal 639 output by the one or more compensators 632 (in a one-supply configuration). Although many types of switches are controlled by electrical gate drive signals, it is also contemplated that optical control signals may be used. For example, the gate drive signal generator 636 may provide optical signals.

Figure 5:
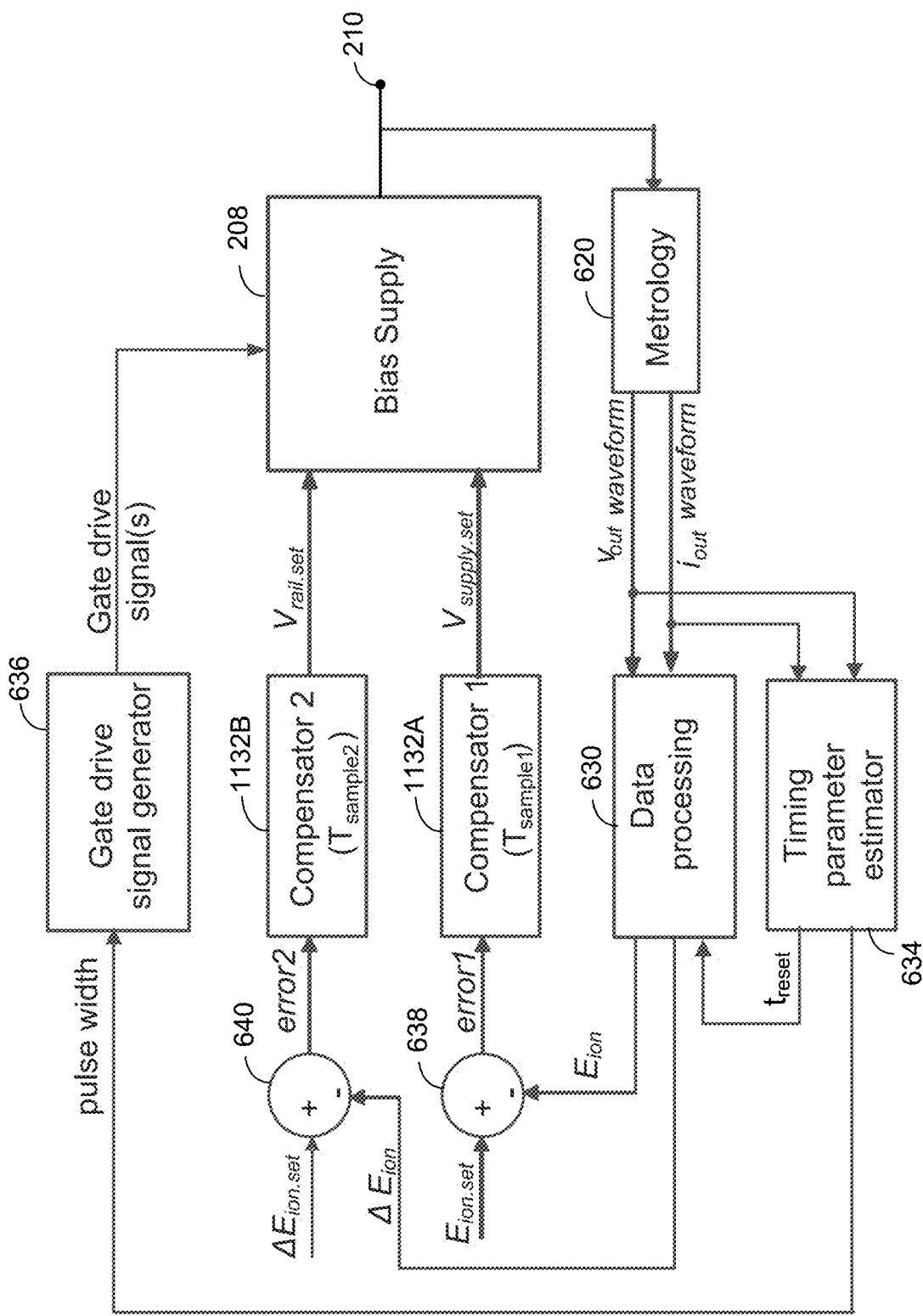
FIG. 5 is a block diagram depicting a control system for a bias supply with two power supplies.

Referring next to FIG. 5, shown is a block diagram depicting a control system for the bias supply 208 of FIG. 2, where the bias supply 208 includes the first power supply ($V_{supply}$) 216 and the second power supply ($V_{rail}$ supply) 218 in a two-supply configuration. The switch network 220 may comprise a variety of different topologies including one or two switches, as will be described below.

As shown in FIGS. 4 and 5, the control system may comprise two control "knobs" to control the DC voltages of $V_{supply}$ and $V_{rail}$. This approach is in contrast to prior approaches that control compensation current $I_{comp}$ (to control a width of a distribution of ion energies) and control $V_{rail}$ to achieve a desirable ion energy, eV. In the approach depicted in FIG. 5, the voltages of the first power supply 216 ($V_{supply}$) and the voltage of the second power supply ($V_{rail}$) may be controlled based on a general relationship:

$$\begin{bmatrix} \Delta \text{Eion} \\ \text{Eion} + \Delta \text{Eion} \end{bmatrix} = \begin{bmatrix} K_{11} & \varepsilon_{12} \\ \varepsilon_{21} & K_{22} \end{bmatrix} \begin{bmatrix} V_{rail} \\ V_{supply} \end{bmatrix} + \begin{bmatrix} -1 \\ 0 \end{bmatrix}$$

$$\frac{I_{ion}}{C_{ch} + C_{sh}} t_{eV} \approx \begin{bmatrix} K_{11} & 0 \\ 0 & K_{22} \end{bmatrix} \begin{bmatrix} V_{rail} \\ V_{supply} \end{bmatrix} + \begin{bmatrix} -1 \\ 0 \end{bmatrix} \frac{I_{ion}}{C_{ch} + C_{sh}} t_{eV}$$

Where:

$$K_{11} = -\frac{C_{sh}}{C_{ch} + C_{sh}} \frac{2}{1+K}$$

$$K = \frac{1 - K_c}{1 + K_c \frac{V_{step}}{V_{ramp}}}, \text{ where } Vramp = vout(t3) - vout(t4);$$

$$K_c = \frac{C_{str} + \frac{C_{ch} C_{sh}}{C_{ch} + C_{sh}}}{C_{str} + C_{ch}}, \text{ where } Cstr = Cstr0 + Cstr1;$$

-continued $$\varepsilon_{12} = \frac{C_{ch}}{C_{ch} + C_{sh}} \frac{2K}{1+K} \frac{T_{sw}}{t_{ramp}}; \text{ and}$$

$$K_{22} = \frac{C_{ch}}{C_{ch} + C_{sh}} \frac{2T_{sw}}{t_{ramp}},$$

where Tsw is the switching period (from $t_4-t_0$).

In this control approach, a first setpoint may be an ion energy setpoint, $E_{ion\_set}$, and a second setpoint may be for a spread (also referred to as a distribution) of ion energies, $\Delta_{Eion\_set}$ (both $E_{ion\_set}$ and $\Delta_{Eion\_set}$ are shown in FIG. 5). The data processing module 630 may calculate $E_{ion}$ and $\Delta_{Eion}$ based upon the digital representations of the output current waveform $i_{out}$ and the voltage waveform $V_{out}$ received from the metrology section 620. As shown, the first comparator 638 may produce the first error signal, error1, based upon the difference between the first setpoint, $E_{ion\_set}$, and the calculated value of $E_{ion}$, and the second comparator 640 may produce a second error signal, error2, based upon the difference between the second setpoint, $\Delta_{Eion\_set}$, and the calculated value of $\Delta_{Eion}$.

Alternatively, the first setpoint (to set ion energy) may be a Vstep setpoint and the second setpoint (to set the spread of ion energies) may be a slope setpoint (to set the slope, of the fourth portion (between times t3 and t4) of the asymmetric periodic voltage waveform) or the second setpoint may be a slope-deviation-factor setpoint (to set the slope deviation factor, Ks). The data processing module 630 may calculate Vstep and the slope or the slope deviation factor, Ks based upon the digital representations of $i_{out}$ and $V_{out}$ received from the metrology section 620. In this alternative, the first comparator 638 may produce the first error signal, error1, based upon the difference between the first setpoint (e.g., a Vstep setpoint) and the calculated value of Vstep, and the second comparator 640 may produce a second error signal, error2, based upon the difference between the second setpoint (either a slope setpoint or a slope-deviation-factor setpoint) and the calculated value of the slope or the calculate value of the slope deviation factor, Ks.

The control system may comprise two compensators: a first compensator 1132A and a second compensator 1132B. The first compensator 1132A may receive the first error signal, error1, and produce a signal, $V_{supply\_set}$, to control the first power supply 216. The second compensator 1132B may receive the second error signal, error2, and produce a signal, $V_{rail\_set}$, to control the second power supply 218. In some variations, the gate drive signal generator 636 may be set with fixed switching times for the first switch (and the second switch in a two-switch bias supply) of the bias supply 208. In other variations, the timing parameter estimator 634 may provide a pulse width signal so that the gate drive signal generator 636 may open (turn off) the switches of the bias supply 208 (thus, controlling the on time of the switches of the bias supply 208) to provide zero current switching. Each of the compensators 1132A, 1132B may be realized by a proportional-integral-derivative (PID) controller, and in some variations, a bandwidth of the first compensator 1132A is set to be different from the bandwidth of the second compensator 1132B, which enables control loops associated with each of the compensators 1132A, 1132B to be decoupled. For example, a sampling rate of each control loop may be set to a different rate to result in the different bandwidths.

Figure 6:
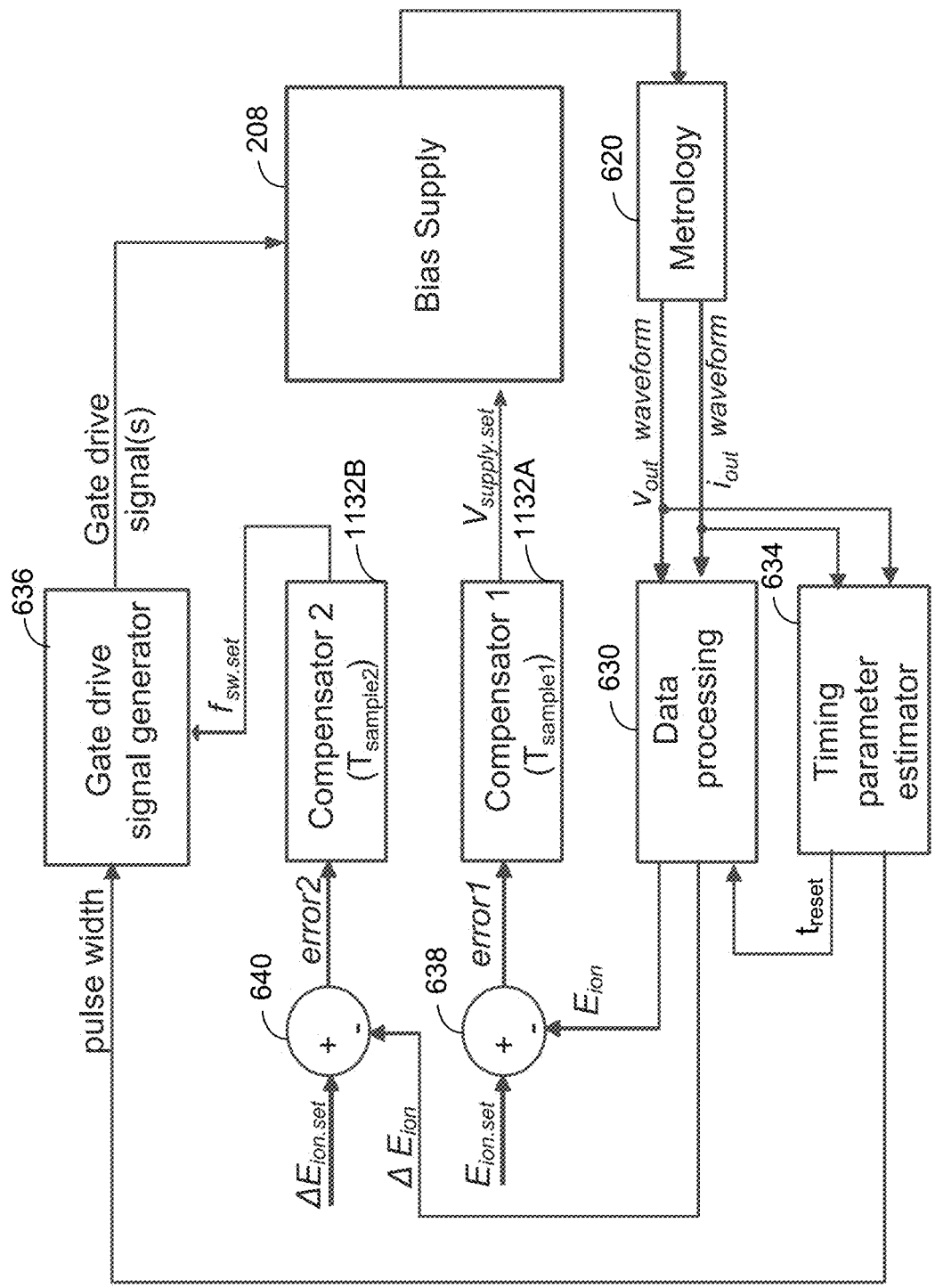
FIG. 6 is a block diagram depicting a control system for a bias supply with one power supply.

Referring next to FIG. 6, shown is a block diagram depicting a control system for the bias supply 208 of FIG. 2, where the bias supply 208 includes only the first power supply 216 ($V_{supply}$) in a one-supply configuration. The switch network 220 may comprise a variety of different topologies including one or two switches, as will be described below. The control system of FIG. 6 for a one-supply configuration is virtually the same as the control system of FIG. 5 for a two-supply configuration except that the second compensator 1132B provides a frequency setpoint signal $f_{sw\_set}$ to control a frequency of the switching of the bias supply 208 (rather than providing a signal, $V_{rail\_set}$, to control the second power supply 218, as in FIG. 5, since the control system of FIG. 6 is a one-supply configuration). Another option, as generalized in FIG. 6, one MIMO compensator 632 can be used with multiple inputs (shown generally as error1 and error2 in FIG. 6) and multiple outputs where Ctrl_knob1 and Ctrl_knob2 in FIG. 6 may be Vsupply_set and Vrail_set, respectively.

Figure 7A:
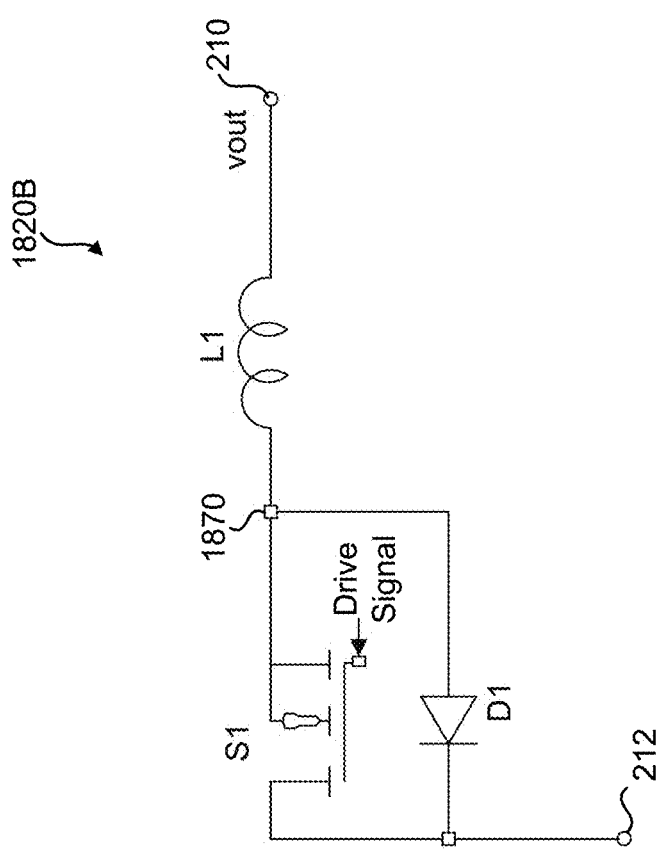
FIG. 7A is a schematic diagram depicting an example of a one-switch network that may be implemented in a bias supply having a one power supply configuration.
Figure 7B:
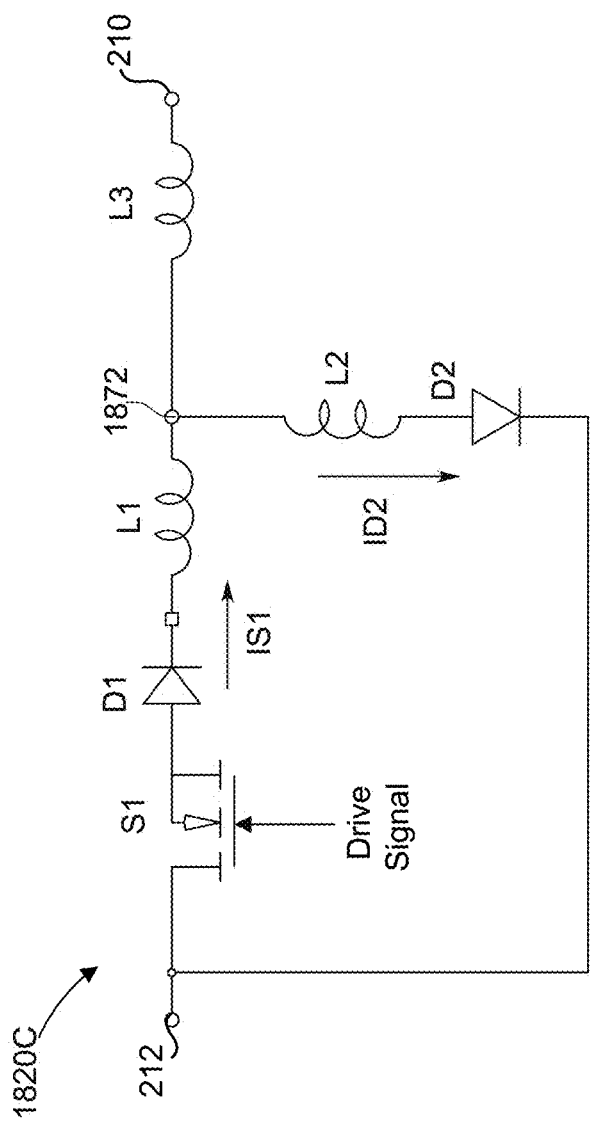
FIG. 7B is a schematic diagram depicting another example of a one-switch network that may be implemented in a bias supply having a one power supply configuration.
Figure 8:
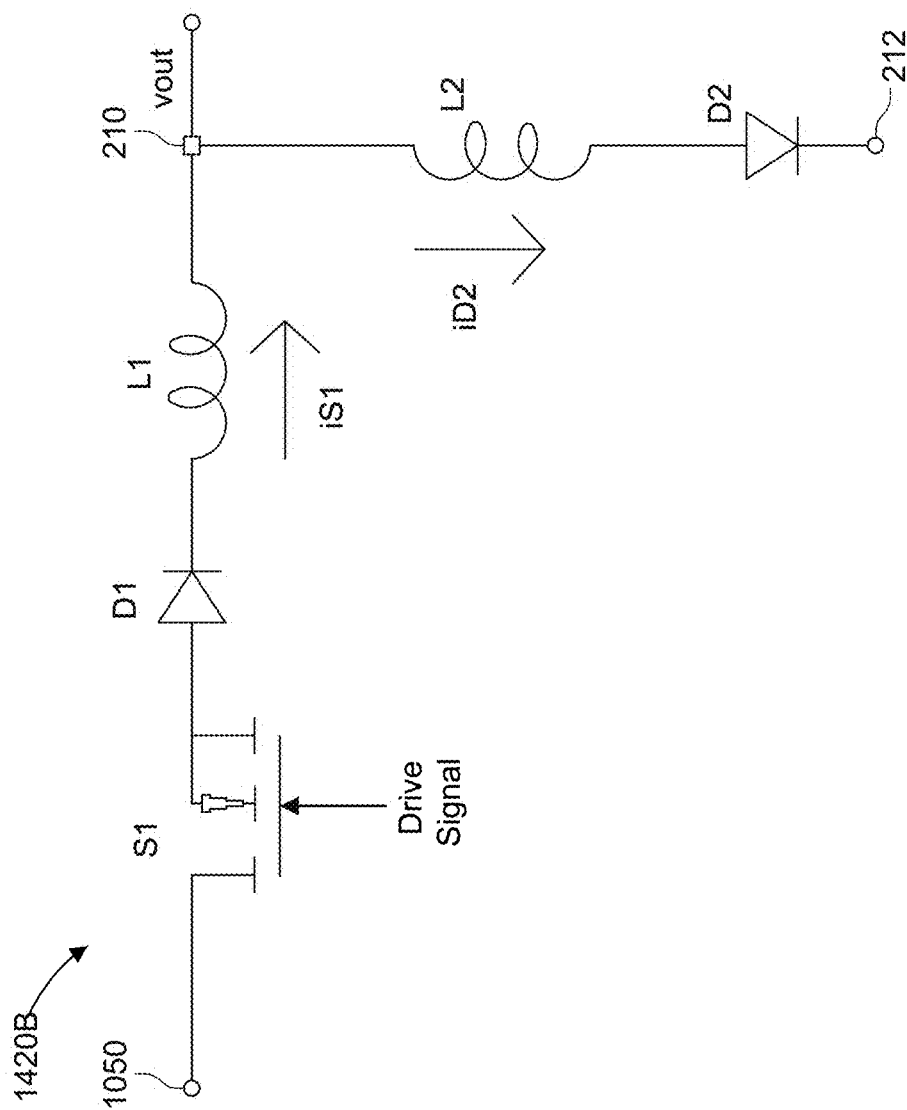
FIG. 8 is a schematic diagram depicting an example of a one-switch network that may be implemented in a bias supply having a two-power supply configuration.

Referring next to FIGS. 7A, 7B and 8, shown are examples of switch networks having one-switch configurations that may be implemented in switch network 220 of bias supply 208 (FIG. 2). FIGS. 7A and 7B depict one-switch configurations that may be implemented in one-supply configurations, that is, where the bias supply 208 includes only the first power supply 216 and is controlled by an associated one-supply control system such as that of FIG. 6. FIG. 8 depicts a one-switch configuration that may be implemented in a two-supply configuration, that is, where the bias supply 208 includes the first power supply 216 and the second power supply 218 and is controlled by an associated two-supply control system such as that of FIG. 5.

In many implementations, the switches disclosed herein are realized by field-effect switches such as metal-oxide semiconductor field-effect transistors (MOSFETS), and in some implementations, the switches are realized by silicon carbide metal-oxide semiconductor field-effect transistors (SiC MOSFETs) or gallium nitride metal-oxide semiconductor field-effect transistors (GaN MOSFETs). As another example, the switches may be realized by an insulated gate bipolar transistor (IGBT). In these implementations, the gate drive signal generator 636 may comprise an electrical driver known in the art that is configured to apply electrical drive signals to the switches responsive to signals from the timing parameter estimator 634 and/or the one or more compensators 632. It is also contemplated that the drive signals may be sent via optical lines to convey optical switching signals. And the switches may switch in response to the optical signal and/or optical signals that are converted to an electrical drive signal.

It should be recognized that each of the switches depicted herein generally represents one or more switches that are capable of closing and opening to connect and disconnect, respectively, a current pathway. For example, each of the switches may be realized by a plurality of switches arranged is series (for enhanced voltage capability), may be realized by a plurality of switches arranged is parallel (for enhanced current capability), or each of the switches may be comprised of a plurality of switches arranged in a series-parallel combination (for enhanced voltage and or current capability). In these variations, one of ordinary skill in the art will recognize that each switch may be synchronously driven by a corresponding drive signal.

It should also me be recognized that any of the diodes depicted herein may be realized by a plurality of diodes. For example, any diode may be realized by a plurality of series-connected diodes (to enhance voltage capability), may be realized by a plurality of diodes arranged in parallel (to enhance current capability), or may be comprised of a plurality of diodes arranged in a series-parallel combination (for enhanced voltage and or current capability).

Referring now to FIG. 7A, shown is a schematic drawing depicting a switch network 1820B that is an example of a switching section 220 having a single switch S1, and that may be deployed in conjunction with a one-supply configuration in which the bias supply 208 includes only the first power supply 216 and is controlled by an associated one-supply control system such as that of FIG. 6. As shown in FIG. 7A, a first inductor L is coupled between a node 1870 and the output node 210. The switch S1 is coupled between the node 1870 and the return node 212. A diode D1 is coupled in parallel with the switch S1 between the node 1870 and the return node 212.

Referring now to FIG. 7B, shown is a schematic drawing depicting a switch network 1820C that is another example of a switching section 220 having a single switch S1, and that may be deployed in conjunction with a one-supply configuration in which the bias supply 208 includes only the first power supply 216 and is controlled by an associated one supply control system such as that of FIG. 6. As shown in FIG. 7B, the switch network 1820C comprises a first current pathway (for current iS1), between the return node 212 and node 1872. The first current pathway comprises a series combination of the switch S1 a diode D1 and an inductor L1. In addition, the switch network 1820C comprises second current pathway (for current iD2), (between the node 1872 and the return node 212), which comprises a second diode D2 and an inductive element L2. As shown, a cathode of diode D2 is coupled to the return node 212, and a third inductor L3 is positioned between the node 1872 and the output node 210.

Referring now to FIG. 8, shown is a schematic drawing depicting a switch network 1420B that is an example of a switching section 220 having a single switch S1, and that may be deployed in conjunction with a two-supply configuration in which the bias supply 208 includes the first power supply 216 and the second power supply 218 and is controlled by an associated two-supply control system such as that of FIG. 5. As shown in FIG. 8, the switch network 1420B comprises a first current pathway (for current iS1), between the node 1050 and the output node 210. The first current pathway comprises a series combination of a switch S1, a diode D1 and an inductor L1. The switch network 1420B also comprises second current pathway (for current iD2), between the output node 210 and the return node 212, which comprises a second diode D2 and an inductor L2.

It should also be recognized, that because the switch S1, the diode D1 and the inductor L1 are arranged in series, the order in which the switch S1, the diode D1 and the inductor L1 are positioned may be changed. In addition, in FIGS. 7B and 8, the order in which L2 and D2 are arranged may be swapped.

Figure 9:
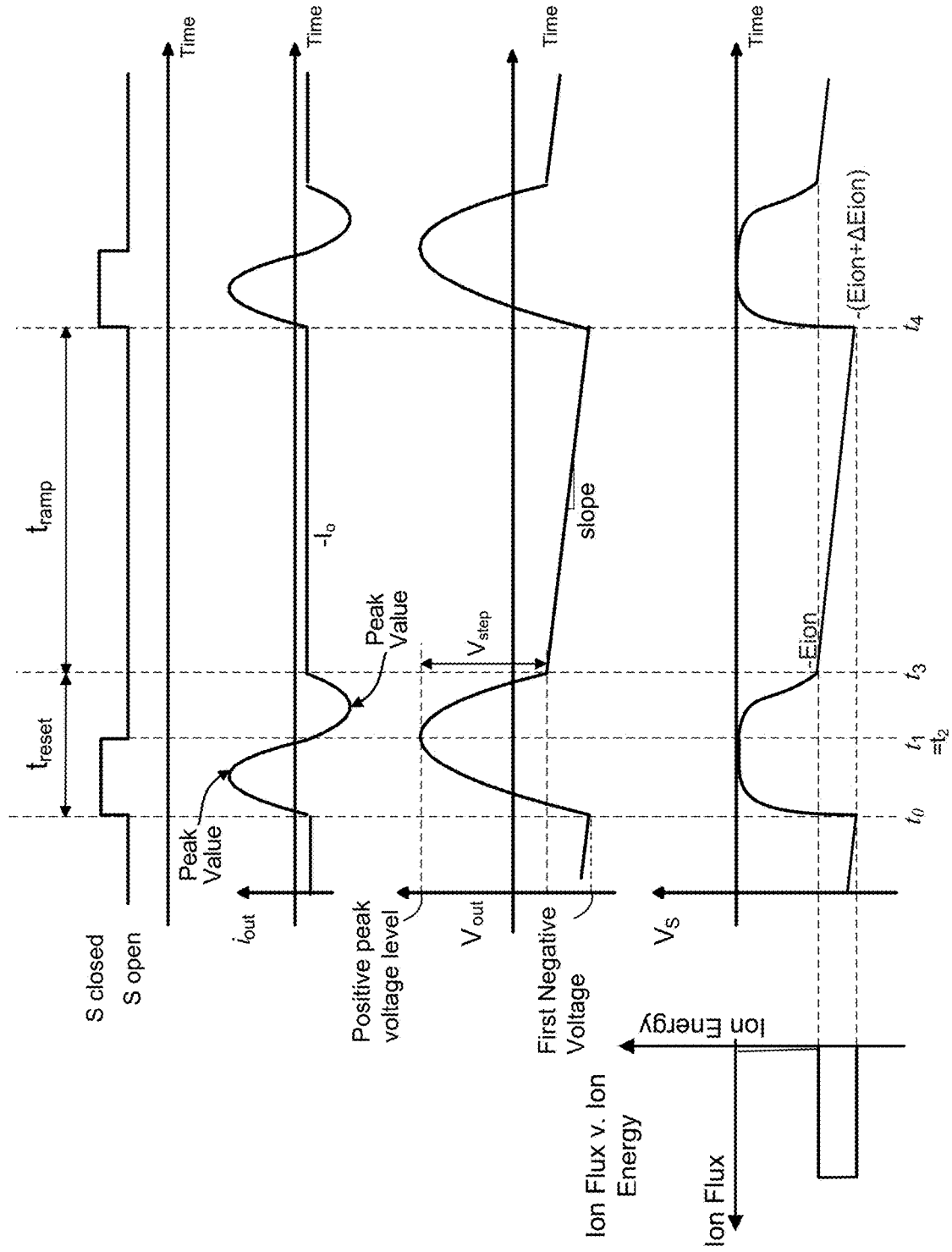
FIG. 9 depicts graphs and a timing diagram illustrating aspects of a bias supply that comprises a single switch.

Referring now to FIG. 9, shown are graphs and a timing diagram illustrating aspects of bias supplies that comprise switching networks having a single switch, such as the switching networks of FIGS. 7A, 7B and 8. As shown in FIG. 9, the switch S1 is closed (turned on) and then opened (turned off) for the time duration of the gate drive pulse width signal in order to produce the output current waveform $i_{out}$, the asymmetric periodic output voltage waveform $V_{out}$, and the sheath voltage waveform $V_s$.

A full cycle of the asymmetric periodic current and voltage waveforms of FIG. 9 extends from time $t_0$ to $t_4$. A first portion of the asymmetric periodic output voltage waveform $V_{out}$ rises at time $t_0$, when switch S1 is closed (turned on), from a first negative voltage to a positive peak voltage level at time $t_1$ ($t_1=t_2$). A second portion of the output voltage waveform $V_{out}$ falls from the positive peak voltage level by an amount Vstep to a third (negative) voltage level at time $t_3$. As will be explained below, the switch S1 is opened (turned off) at or before the time $t_3$. During the time $t_3$ to $t_4$, a third (negative ramping) portion of the asymmetrical periodic voltage $V_{out}$ ramps down in a steadily and negatively until the switch S1 is closed (turned on) again at time $t_4$.

A first portion of the output current waveform $i_{out}$ rises at time $t_0$, when switch S1 is closed (turned on), from a threshold current value to a positive peak current value. A second portion of the output current waveform $i_{out}$ falls from the positive peak current value, makes a first crossing of the threshold current value at time $t_1$ ($t_1=t_2$), and reaches a negative peak current value in an opposite direction. It should be recognized the absolute values of the positive peak current value and the negative peak current value may be different. As will be explained below, the switch S1 is opened (turned off) at or after the time of the first crossing of the threshold current value. A third portion of the output current waveform $i_{out}$ then rises from the negative peak current value to reach the threshold current value again at time $t_3$. From time $t_3$ to $t_4$, a fourth portion of the output current waveform $i_{out}$ flattens out and eventually reaches $-I_o$.

The voltage waveform $V_{out}$ produces a sheath voltage waveform $V_s$ that is generally negative in order to attract ions to impact a surface of the workpiece to enable etching of the workpiece 103. During the time $t_0$ to $t_1$ ($t_1=t_2$), the first portion of the asymmetric periodic voltage waveform $V_{out}$ causes the sheath voltage $V_s$ to approach a positive voltage to repel positive charges that accumulate on the surface of the workpiece while the surface of the workpiece is held at a negative voltage. During the time $t_2$ to $t_3$, the second portion of the asymmetric periodic voltage waveform $V_{out}$ falls by an amount $V_{step}$ and causes the sheath voltage $V_s$ to become a desired negative voltage (or range of voltages) to achieve an ion flux that achieves a desired ion energy. $V_{step}$ corresponds to a sheath voltage at $t_3$ that produces ions at any energy level, $-E_{ion}$. During the third portion of the asymmetric periodic voltage waveform, the sheath voltage may become more negative so that at t4, ions at an energy level of $-(E_{ion}+\Delta_{Eion})$ are produced.

Also shown in FIG. 9 are times $t_{reset}$ (between times $t_0$ and $t_3$) and $t_{ramp}$ (between times $t_3$ and $t_4$). As shown, $t_{reset}$ covers a time that includes both the first and second portions of the asymmetric periodic voltage waveform $V_{out}$, and $t_{ramp}$ includes the third ramping portion of the voltage waveform $V_{out}$.

Also shown in FIG. 9 are examples of the compensation current $I_{comp}$ referenced in FIG. 2. The compensation current $I_{comp}$ may be provided throughout the application of the asymmetric periodic voltage function $V_{out}$, and $I_{out}$ may or may not equal $I_{comp}$ during the third portion of the asymmetric periodic voltage waveform $V_{out}$ (during tramp). The compensation current $I_{comp}$ may compensate for ion current in the plasma chamber 101. Without the compensation current $I_{comp}$, the sheath voltage $V_s$ may gradually change to become more positive during the third portion of the asymmetric periodic voltage, which creates a broader distribution of ion energies, which may be undesirable. In some variations, however, the compensation current $I_{comp}$ may intentionally be set to overcompensate or undercompensate for ion current in the plasma chamber 101 to create a broader distribution of ion energies. In the mode of operation depicted in FIG. 9, the compensation current $I_{comp}$ provides a sheath voltage $V_s$ that negatively ramps in correspondence with the third (negative ramping) portion of the voltage waveform $V_{out}$.

The fundamental period (from $t_0$ to $t_4$) of the asymmetric periodic voltage waveform $V_{out}$ may be adjusted to adjust a spread of ion energies. As shown in FIG. 9, a full current cycle occurs between times $t_0$ and $t_3$ during the first and second portions of the asymmetric periodic voltage waveform $V_{out}$. And the time between full current cycles is the time, $t_{ramp}$, between $t_3$ and $t_4$. An aspect of the present disclosure addresses the problem of how to adjust the output current, $I_{out}$, to compensate for the ion current $I_{ion}$. Another aspect of the present disclosure addresses the problem of how to adjust a level of ion energies and distribution of the ion energies in the plasma chamber.

To control a bias supply having a one-switch network, the timing parameter estimator 634 may detect when the output current $i_{out}$ reverses (crosses the threshold current value) and may generate a pulse width signal t0 the gate drive signal generator 636 to cause the switch S1 to close (turn on) at time $t_0$ and then open (turn off) at or after the time that the current crosses the threshold current value. In particular, switch S1 stays closed (turned on) for the duration of the gate drive pulse width and opens (turns off) when the pulse width signal ends. Once the current reverses direction, current is no longer flowing through switch S1, and switch S1 may thereafter be opened (turned off) to reduce losses. While the switch S1 need not be opened (turned off) immediately upon crossing the threshold, it must be opened (turned off) before the reset time $t_{reset}$ so that the voltage output waveform $V_{out}$ takes on the downward ramp profile during time $t_{ramp}$. Therefore, there is a range between minimum and maximum pulse widths that the pulse width can fall within. FIGS. 10-16, described below, address computing the gate pulse width and reset time $t_{reset}$.

Figure 10:
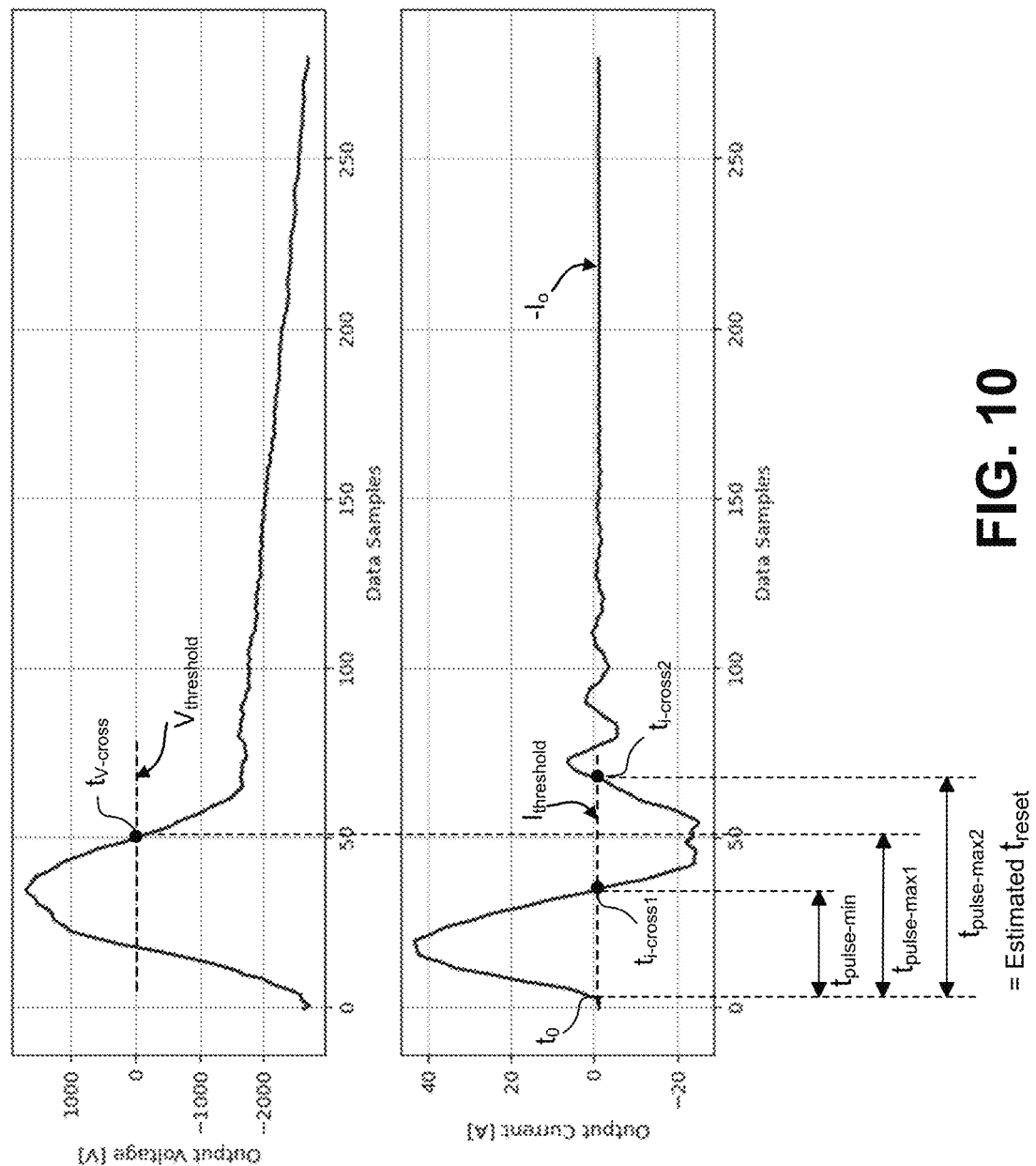
FIG. 10 depicts complete digital representations of one cycle of the asymmetrical periodic output voltage and current waveforms associated with implementations of bias supplies having one switch.

Referring now to FIG. 10, shown are graphs depicting complete digital representations of one cycle of the asymmetrical periodic output voltage and output current waveforms $V_{out}$ and $i_{out}$ associated with implementations of bias supplies 208 that have one switch. FIG. 10 illustrates various timing parameters used by timing parameter estimator 634 to calculate the gate drive pulse width provided to gate drive signal generator 636, and to calculate the reset time $t_{reset}$ provided to data processing module 630. In the description of FIG. 10, the times $t_0$-$t_4$ correspond to the times $t_0$-$t_4$ of the timing diagram of FIG. 9.

Timing parameter estimator 634 receives the complete digital representations of the asymmetrical periodic voltage waveform $V_{out}$, the output current waveform $i_{out}$ and/or the compensation current $I_{comp}$ from metrology section 620. From these waveforms, timing parameter estimator 634 can accurately compute the gate drive pulse width that is provided to gate drive signal generator 636 so that switch S1 is opened (turned off) at an appropriate time with minimal losses. Timing parameters estimator 634 also computes the reset time $t_{reset}$ that is provided to data processing module 630. The reset time $t_{reset}$ is used to find the starting point of the ramp (third) portion of the voltage waveform $V_{out}$, and is the time by which the switch S1 must be opened (turned off)

As shown in FIG. 10, the output voltage waveform $V_{out}$ rises during a first portion from a beginning negative voltage at time $t_0$, when switch S1 is closed (turned on), to a positive peak voltage value at time $t_1$. then falls during a second portion to an intermediate (third) negative voltage at time $t_3$, and then ramps down steadily and gradually during a third portion to an ending negative voltage at time $t_4$. Since time $t_4$ is the end of the cycle and the beginning of a new cycle, the ending negative voltage should be approximately equal to the beginning negative voltage. While falling between times $t_1$ and $t_2$, the voltage crosses the threshold voltage value $V_{threshold}$ at voltage threshold crossing time $t_{v-cross}$. The threshold voltage value $V_{threshold}$ is typically at or near zero volts.

The output current waveform $i_{out}$ rises beginning at time $t_0$, when the switch S1 is closed (turned on) during a first portion from a threshold current value $i_{threshold}$ to a positive peak current current value. A second portion of the output current waveform $i_{out}$ falls from the positive peak current value to a negative peak current value. During the second portion, the output current waveform $i_{out}$ crosses a threshold current value $i_{threshold}$ for a first time at first threshold current crossing time $t_{i-cross1}$. It is at this time that a window for opening (turning off) the switch S1 begins. A third portion of the output current waveform $i_{out}$ rises from the negative peak current value to cross the threshold current value $I_{threshold}$ for a second time at second threshold current crossing time $t_{i-cross2}$. It is at this time that the window for opening (turning off) the switch S1 ends. A fourth portion of the output current waveform $i_{out}$ then gradually flattens out to a slightly negative compensation current value $-I_{comp}$.

Figure 11:
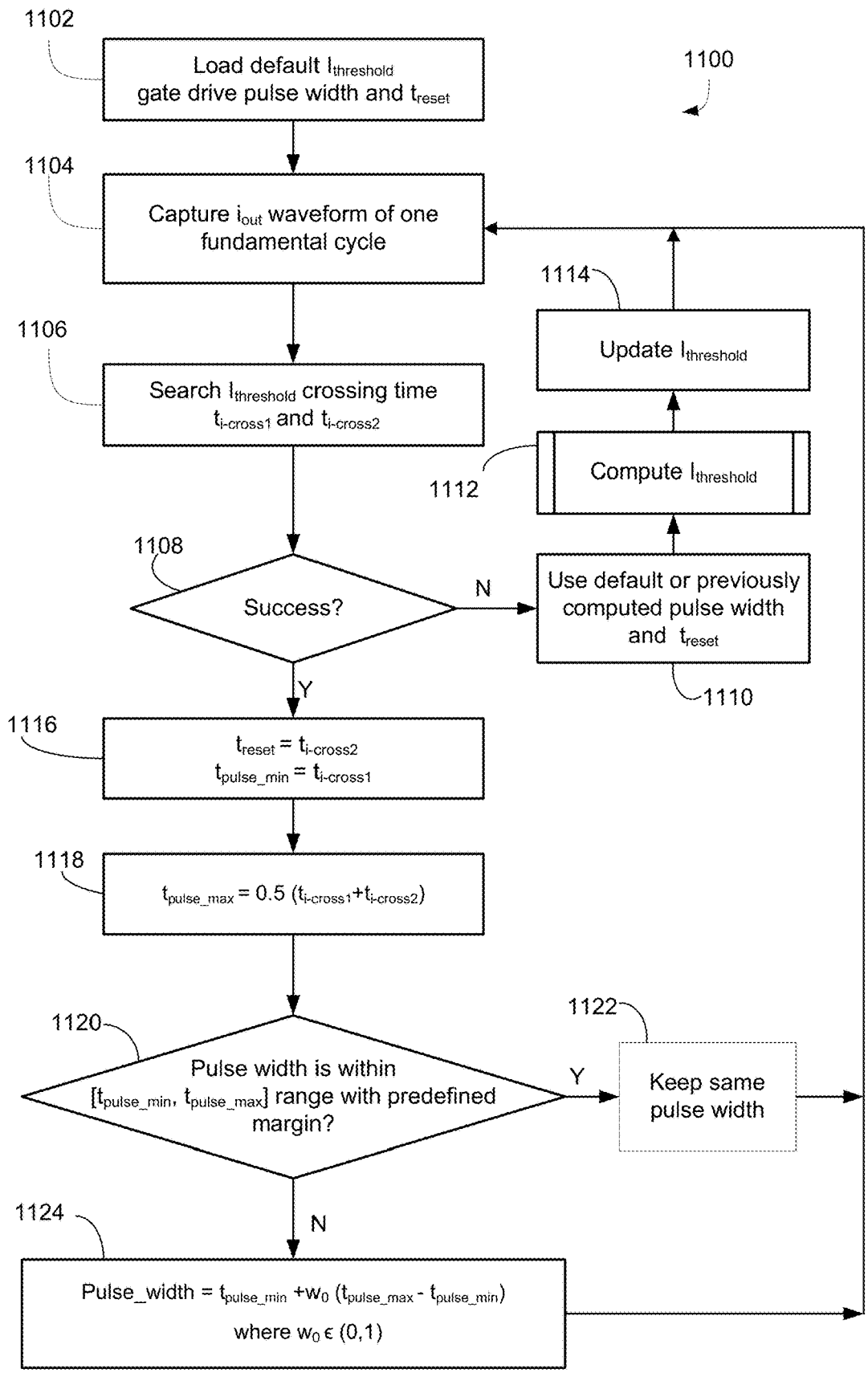
FIG. 11 is a flowchart depicting a method for setting the gate drive pulse width and reset time that may be performed in conjunction with bias supplies having a one-switch network and either one or two power supplies.

Referring now to FIG. 11, shown is a flowchart depicting a method 1100 performed by timing parameters estimator 634 associated with implementations of bias supplies 208 that have one switch, for setting the gate drive pulse width and reset time $t_{reset}$. Method 1100 may be performed in conjunction with either the one-switch, one-supply configuration of FIG. 7B or the one-switch, two-supply configuration of FIG. 8. Method 1100 of FIG. 11 sets the maximum gate drive pulse width using the output current waveform $i_{out}$. An alternate method 1200 that sets the maximum gate drive pulse width using the voltage waveform $V_{out}$ is discussed with reference to FIG. 12.

In step 1102, timing parameter estimator 634 loads a default threshold current value $I_{threshold}$, a default gate drive pulse width, and a default reset time $t_{reset}$. In step 1104, timing parameter estimator 634 captures the output current waveform out of one fundamental cycle. In one example, for instance, estimator 634 captures one cycle of the complete digital representation of asymmetric periodic current waveform $i_{out}$ that is provided by metrology section 620, as is depicted in FIG. 10. In step 1106, timing parameter estimator 634 searches the output current waveform $i_{out}$ for the first threshold current crossing time $t_{i-cross1}$ and the second threshold current crossing time $t_{i-cross2}$.

In step 1108, if the threshold current crossing times $t_{i-cross1}$ and $t_{i-cross2}$ are not found in step 1106, the method proceeds to step 1110 to set the gate drive pulse width as the default pulse width value or the previously computed pulse width, and to set the reset time $t_{reset}$ as the default reset time or the previously computed reset time. In step 1112, the threshold current value $I_{threshold}$ is computed as described with reference to FIG. 14, and the threshold current value $I_{threshold}$ is updated with this computed value in step 1114. The method 1100 then loops back to step 1104 to capture the next cycle of the asymmetric periodic current waveform $i_{out}$ that is provided by metrology section 620, and the method repeats from there.

In step 1108, if the threshold current crossing times $t_{i-cross1}$ and $t_{i-cross2}$ are found in step 1106, the method proceeds to step 1116. In step 1116, the reset time is set to be the second threshold current crossing time ($t_{reset}=t_{i-cross2}$). In other words, the reset time $t_{reset}$ is set to be the total time that it takes the output current waveform $i_{out}$ to rise to its positive peak current value, fall to its negative peak current value (crossing the threshold current value $I_{threshold}$ for a first time), and then rise again to reach the threshold current value $I_{threshold}$ for a second time.

As noted above, the pulse width may be set within a range between maximum and minimum pulse widths. Also in step 1116, the minimum pulse width is set to be the first threshold current crossing time ($t_{pulse\_min}=t_{i-cross1}$). In other words, the minimum pulse width $t_{pulse\_min}$ is set to be the total time from time $t_0$ that it takes the output current waveform $i_{out}$ to rise to its positive peak current value and then fall to reach the threshold current value $I_{threshold}$ for the first time. In step 1118, the maximum pulse width $t_{pulse\_max}$ is set to be midway between the first time that the output current waveform $i_{out}$ crosses the threshold current value $i_{threshold}$ and the second time that the output current waveform Iout crosses the threshold current value $I_{threshold}$, i.e., $t_{pulse\_max}=0.5(t_{i-cross1}+t_{i-cross2})$.

Step 1120 determines whether the current pulse width is within the range between the minimum pulse width $t_{pulse-min}$ and the maximum pulse width $t_{pulse\_max}$ within a predefined margin, which is a design choice value. If the current pulse width is within this range, the current pulse width is kept as the pulse width (step 1122), and the method 1100 then loops back to step 1104 to capture the next cycle of the asymmetric periodic current waveform $i_{out}$ that is provided by metrology section 620, and the method repeats from there.

In step 1120, if the current pulse width is not within the range between the minimum pulse width $t_{pulse-min}$ and the maximum pulse width $t_{pulse\_max}$ with the predefined margin, then the pulse width is recalculated in step 1124. The pulse width is set to be somewhere between the minimum pulse width $t_{pulse\_min}$ and the maximum pulse width $t_{pulse\_max}$. In one example, the pulses width is computed as pulse_width=$t_{pulse\_min}+w_0(t_{pulse\_max}-t_{pulse\_min})$, where $w_0$ is a design choice value between 0 and 1. After the pulse width is recalculated in step 1124, the method 1100 loops back to step 1104 to capture the next cycle of the asymmetric periodic current waveform $i_{out}$ that is provided by metrology section 620, and the method repeats from there.

Figure 12:
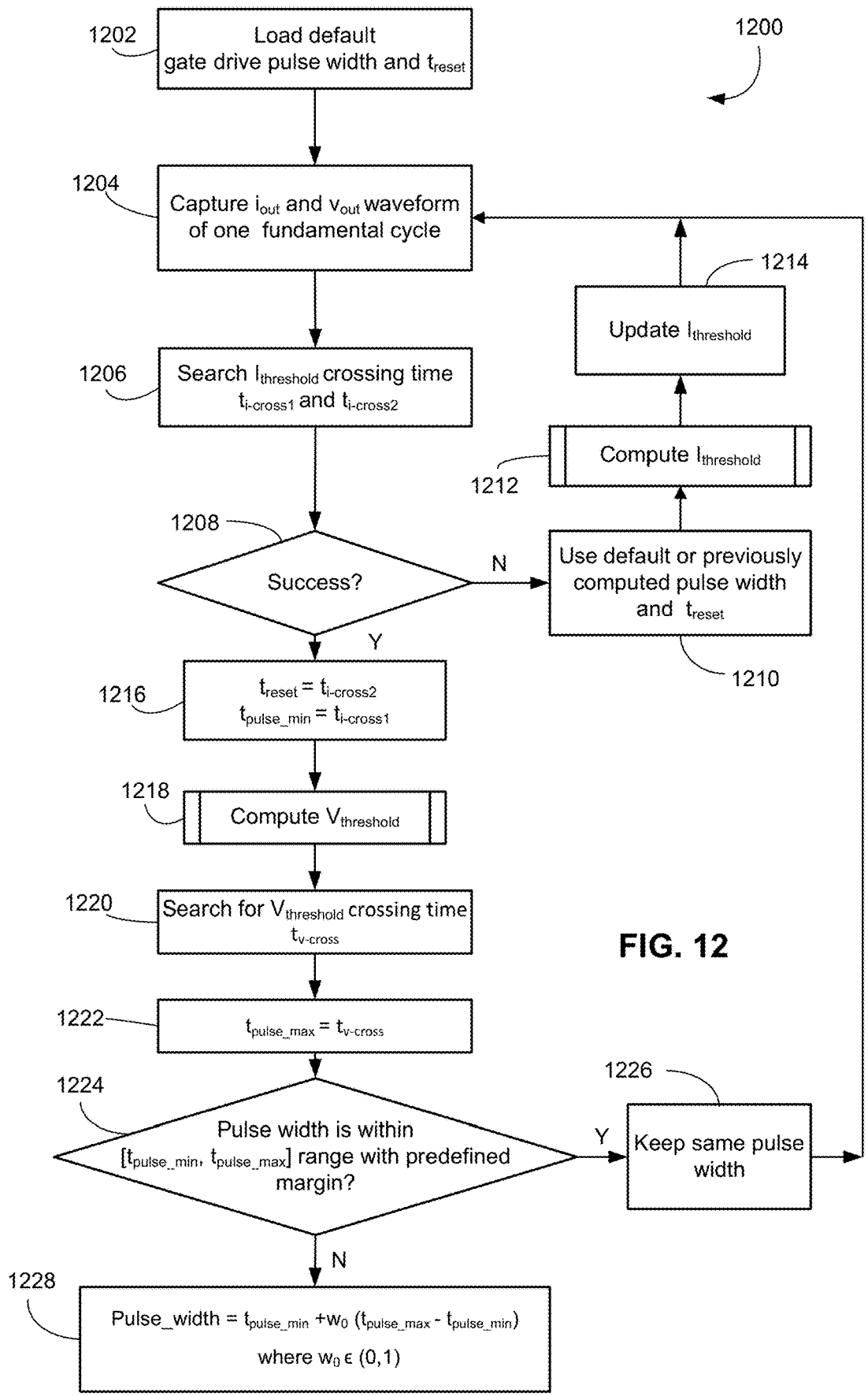
FIG. 12 is a flowchart depicting another method for setting the gate drive pulse width and reset time that may be performed in conjunction with bias supplies having a one-switch network and either one or two power supplies.

Referring now to FIG. 12, shown is a flowchart depicting an alternate method 1200 that may be performed by timing parameters estimator 634, associated with implementations of bias supplies 208 that have one switch, for setting the gate drive pulse width and reset time $t_{reset}$. Method 1200 uses the voltage waveform $V_{out}$ to set the maximum gate drive pulse width, in contrast to method 1100 of FIG. 11 which uses the output current waveform $i_{out}$ to set the maximum gate drive pulse width. Like method 1100, method 1200 may be performed in conjunction with either the one-switch, one-supply configuration of FIG. 7B or the one-switch, two-supply configuration of FIG. 8.

Referring now to FIG. 12, in step 1202, timing parameter estimator 634 loads a default gate drive pulse width and a default reset time $t_{reset}$. In step 1204, timing parameter estimator 634 captures the output current waveform $i_{out}$ and the voltage waveform $V_{out}$ of one fundamental cycle. In one example, for instance, estimator 634 captures one cycle of the complete digital representations of asymmetric periodic current waveform iout and asymmetric periodic voltage waveform $V_{out}$ that are provided by metrology section 620, as are depicted in FIG. 10. In step 1206, timing parameter estimator 634 searches the output current waveform $i_{out}$ for the first threshold current crossing time $t_{i-cross1}$ and the second threshold current crossing time $t_{i-cross2}$.

In step 1208, if the threshold current crossing times $t_{i-cross1}$ and $t_{i-cross2}$ are not found in step 1206, the method proceeds to step 1210 to set the gate drive pulse width as the default pulse width or the previously computed pulse width, and to set the reset time $t_{reset}$ as the default reset time or the previously computed reset time. In step 1212, the threshold current value $I_{threshold}$ is computed as described with reference to FIG. 14, and the threshold current value $I_{threshold}$ is updated with this computed value in step 1214. The method 1200 then loops back to step 1204 to capture the next cycle of the asymmetric periodic current and voltage waveforms $i_{out}$ and $V_{out}$ that are provided by metrology section 620, and the method repeats from there.

In step 1208, if the threshold current crossing times $t_{i-cross1}$ and $t_{i-cross2}$ are found in step 1206, the method proceeds to step 1216. In step 1216, the reset time is set to be the second threshold current crossing time ($t_{reset}=t_{i-cross2}$). In other words, the reset time $t_{reset}$ is set to be the total time that it takes the output current waveform iout to rise to its positive peak current value, fall to its negative peak current value (crossing the threshold current $I_{threshold}$ for a first time), and then rise again to reach the threshold current value $I_{threshold}$ for a second time. Also in step 1216, the minimum pulse width is set to be the first threshold current crossing time ($t_{pulse\_min}=t_{i-cross1}$). In other words, the minimum pulse width $t_{pulse\_min}$ is set to be the total time that it takes the output current waveform iout to rise to its positive peak current value and then fall to reach the threshold current value $I_{threshold}$ for the first time.

Figure 15:
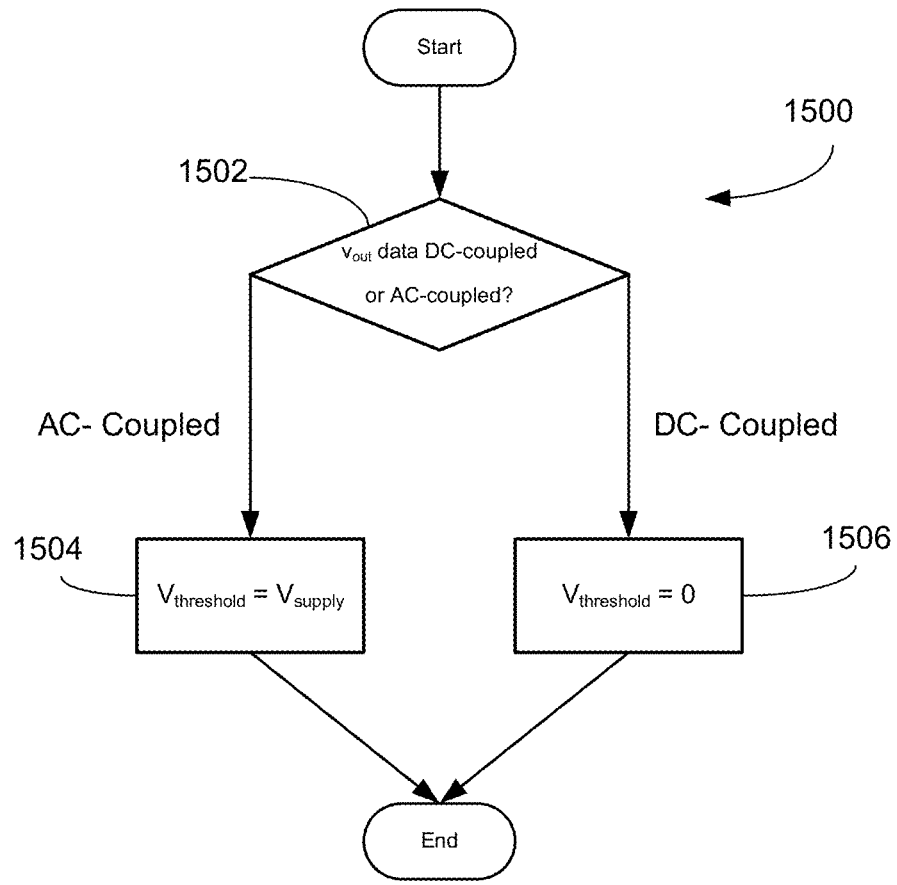
FIG. 15 is a flowchart depicting a method for computing the threshold voltage value in conjunction with bias supplies having a one switch, one power supply configuration.
Figure 16:
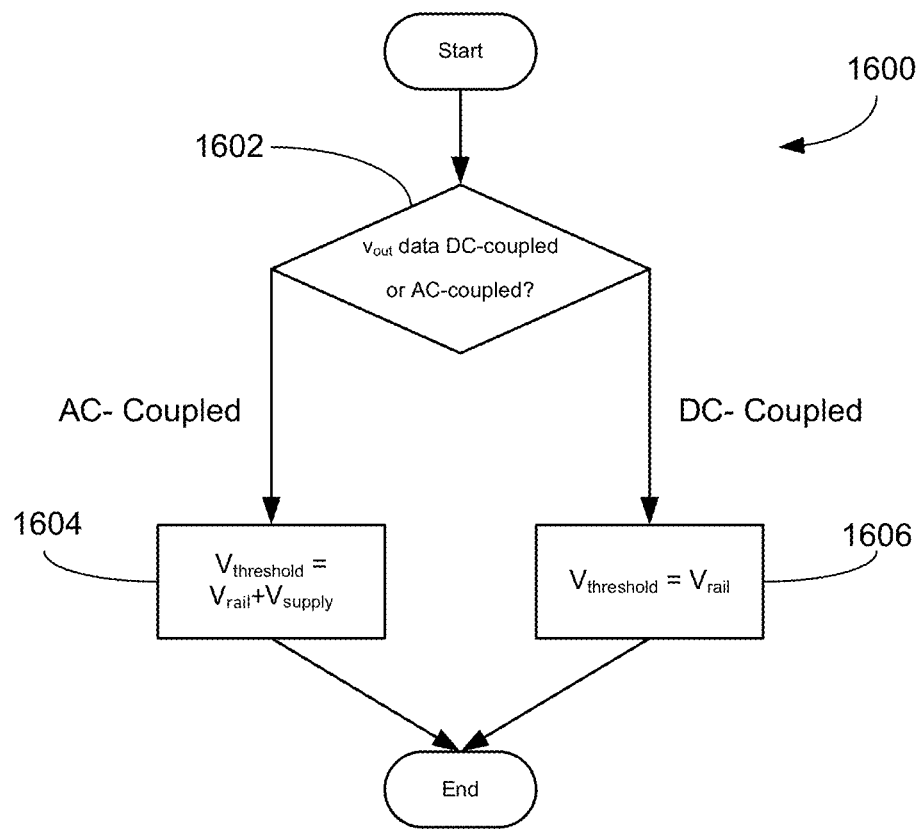
FIG. 16 is a flowchart depicting a method for computing the threshold voltage value in conjunction with bias supplies having a one switch, two power supply configuration.

In step 1218, the threshold voltage value $V_{threshold}$ (see FIG. 10) is computed. When using the one-switch, one-supply configuration of FIG. 7B, the threshold voltage value $V_{threshold}$ is computed as shown in FIG. 15. When using the one-switch, two-supply configuration of FIG. 8, the threshold voltage value $V_{threshold}$ is computed as shown in FIG. 16.

In step 1220, after the threshold voltage value $V_{threshold}$ is computed, timing parameter estimator 634 searches the voltage waveform $V_{out}$ for the voltage threshold crossing time tv-cross, and in step 1222, the maximum pulse width is set to be voltage threshold crossing time tv-cross ($t_{pulse\_max}=t_{v-cross}$). In other words, the maximum pulse width is set to be the total time that it takes the voltage waveform $V_{out}$ to rise to its positive peak voltage value and then fall to reach the threshold voltage value $V_{threshold}$.

Step 1224 determines whether the current pulse width is within the range between the minimum pulse width $t_{pulse-min}$ and the maximum pulse width $t_{pulse\_max}$ with a predefined margin, which is a design choice value. If the current pulse width is within this range, the current pulse width is kept as the pulse width (step 1226), the method 1200 loops back to step 1204 to capture the next cycle of the asymmetric periodic current and voltage waveforms $i_{out}$ and $V_{out}$ that are provided by metrology section 620, and the method repeats from there.

In step 1224, if the current pulse width is not within the range between the minimum pulse width $t_{pulse-min}$ and the maximum pulse width $t_{pulse\_max}$ with the predefined margin, then the pulse width is recalculated in step 1228. The pulse width is set to be somewhere between the minimum pulse width $t_{pulse\_min}$ and the maximum pulse width $t_{pulse\_max}$. In one example, the pulse width is computed as pulse_width=$t_{pulse\_min}+w_0(t_{pulse\_max}-t_{pulse\_min})$, where $w_0$ is a design choice value between 0 and 1. After the pulse width is recalculated in step 1228, the method 1200 loops back to step 1204 to capture the next cycle of the asymmetric periodic current and voltage waveforms $i_{out}$ and $V_{out}$ that are provided by metrology section 620, and the method repeats from there.

Figure 13:
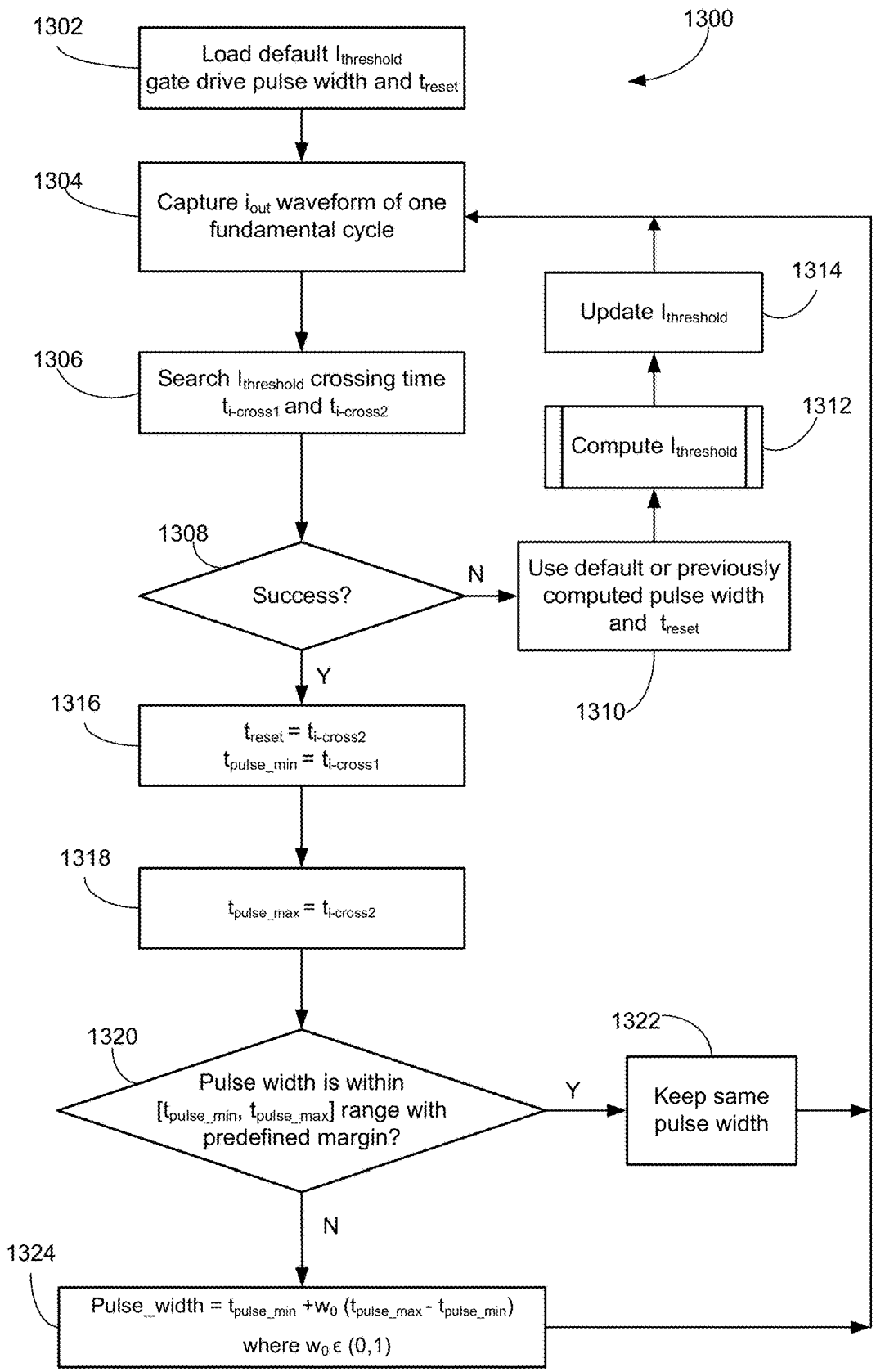
FIG. 13 is a flowchart depicting a method for setting the gate drive pulse width and reset time that may be performed in conjunction with bias supplies having a one-switch network and one power supply.

FIG. 13 is a flowchart depicting a method 1300 performed by timing parameter estimator 634, associated with implementations of bias supplies 208 that have one switch and one supply, for setting the gate drive pulse width and reset time $t_{reset}$. Method 1300 may be performed, for example, in conjunction with the one-switch, one-supply configuration of FIG. 7A.

Referring now to FIG. 13, in step 1302, timing parameter estimator 634 loads a default threshold current value $I_{threshold}$, a default gate drive pulse width, and a default reset time $t_{reset}$. In step 1304, timing parameter estimator 634 captures the output current waveform $I_{out}$ of one fundamental cycle. In one example, for instance, estimator 634 captures one cycle of the complete digital representation of asymmetric periodic current waveform $i_{out}$ that is provided by metrology section 620, as is depicted in FIG. 10. In step 1306, timing parameter estimator 634 searches the output current waveform $i_{out}$ for the first threshold current crossing time $t_{i-cross1}$ and the second threshold current crossing time $t_{i-cross2}$.

In step 1308, if the threshold current crossing times $t_{i-cross1}$ and $t_{i-cross2}$ are not found in step 1306, the method proceeds to step 1310 to set the gate drive pulse width as the default pulse width or the previously computed pulse width, and to set the reset time $t_{reset}$ as the default reset time or the previously computed reset time. Then, in step 1312, the threshold current value $I_{threshold}$ is computed as described with reference to FIG. 14, and the threshold current $I_{threshold}$ is updated with this computation in step 1314. The method 1300 then loops back to step 1304 to capture the next cycle of the asymmetric periodic current waveform $i_{out}$ that is provided by metrology section 620, and the method repeats from there.

In step 1308, if the threshold current crossing times $t_{i-cross1}$ and $t_{i-cross2}$ are found in step 1306, the method proceeds to step 1316. In step 1316, the reset time is set to be the second threshold current crossing time ($t_{reset}=t_{i-cross2}$). In other words, the reset time $t_{reset}$ is set to be the total time that it takes the output current waveform $i_{out}$ to rise to its positive peak current value, fall to its negative peak current value (crossing the threshold current $I_{threshold}$ for a first time), and then rise again to reach the threshold current $I_{threshold}$ for a second time.

Also in step 1316, the minimum pulse width is set to be the first threshold current crossing time ($t_{pulse\_min}=t_{i-cross1}$). In other words, the minimum pulse width $t_{pulse\_min}$ is set to be the total time that it takes the output current waveform $i_{out}$ to rise to its positive peak current value and then fall to reach the threshold current value $I_{threshold}$ for the first time. In step 1318, the maximum pulse width is set to be the second threshold current crossing time ($t_{pulse\_max}=t_{i-cross2}$). In other words, the maximum pulse width $t_{pulse\_max}$ is set to be the same as the reset time $t_{reset}$.

Step 1320 determines whether the current pulse width is within the range between the minimum pulse width $t_{pulse-min}$ and the maximum pulse width $t_{pulse\_max}$ with a predefined margin. If the current pulse width is within this range, the current pulse width is kept as the pulse width (step 1322), and the method 1300 then loops back to step 1304 to capture the next cycle of the asymmetric periodic current waveform $i_{out}$ that is provided by metrology section 620, and the method repeats from there.

In step 1320, if the current pulse width is not within the range between the minimum pulse width $t_{pulse-min}$ and the maximum pulse width $t_{pulse\_max}$ with a predefined margin, which is a design choice value, then the pulse width is recalculated in step 1324. The pulse width is set to be somewhere between the minimum pulse width and the maximum pulse width. In one example, the pulse width is computed as pulse_width=$t_{pulse\_min}$+$w_0$($t_{pulse\_max}$−$t_{pulse\_min}$), where $w_0$ is a design choice value between 0 and 1. After the pulse width is recalculated in step 1324, the method 1300 loops back to step 1304 to capture the next cycle of the asymmetric periodic current waveform $i_{out}$ that is provided by metrology section 620, and the method repeats from there.

In sum, FIGS. 11-13 depict three different methods for computing the gate drive pulse width and the reset time $t_{reset}$ in one-switch configurations, and these methods differ primarily in how the maximum gate drive pulse width is computed. When the one-switch, one supply configuration of FIG. 7B or the one-switch, two-supply configuration of FIG. 8 is used, the maximum gate drive pulse width may be computed by using the output current waveform Iout, where $t_{pulse\_max}$=0.5($t_{i-cross1}$+$t_{i-cross2}$); or by using the output voltage waveform $V_{out}$, where $t_{pulse\_max}$=$t_{v-cross}$. When the one-switch, one-supply configuration of FIG. 7A is used, the maximum gate drive pulse width is computed by using the output current waveform $I_{out}$, where $t_{pulse\_max}$=$t_{i-cross2}$−$t_{reset}$.

Figure 14:
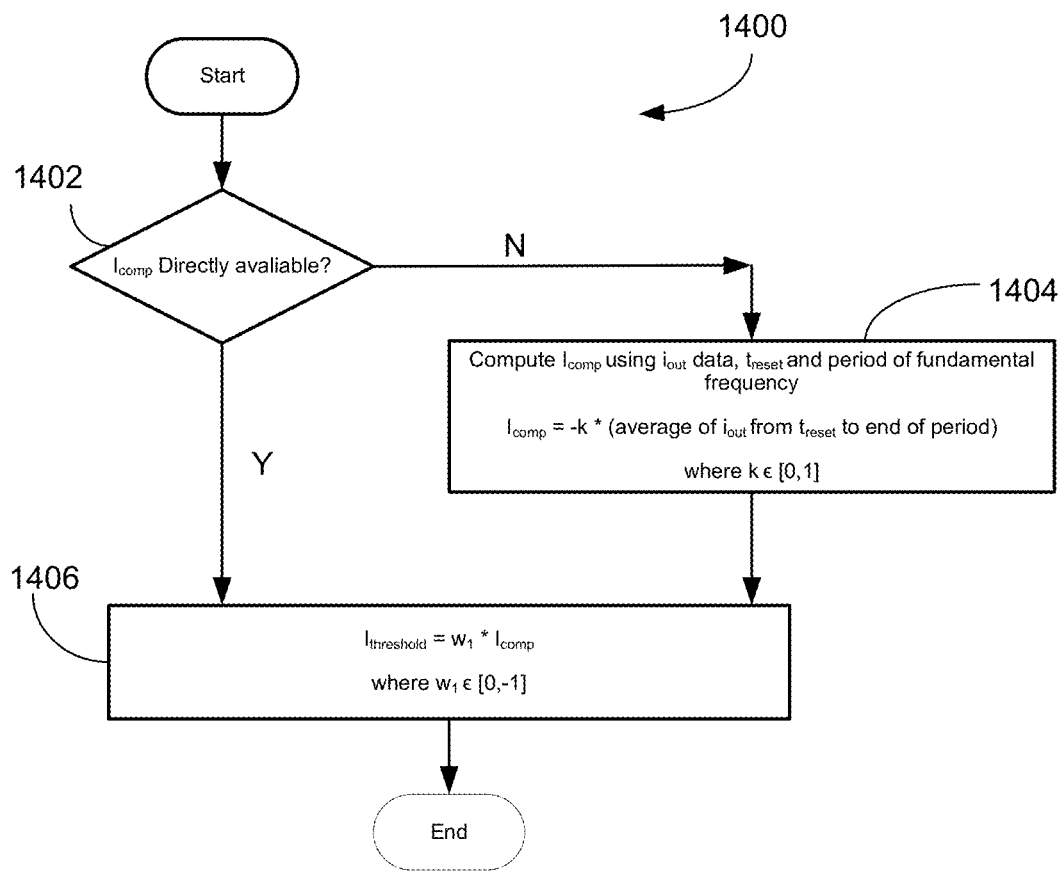
FIG. 14 is a flowchart depicting a method for computing the threshold current value in conjunction with bias supplies having a one-switch network.

Referring now to FIG. 14, shown is a flowchart depicting a method 1400 for computing the threshold current value $I_{threshold}$ in step 1112 of FIG. 11, step 1212 of FIG. 12, and step 1312 of FIG. 13. Thus, FIG. 14 is used to compute the threshold current $I_{threshold}$ value in any of the methods used in conjunction with the one-switch configurations of FIGS. 7A, 7B and 8.

Step 1402 of method 1400 determines whether the compensation current value $I_{comp}$ is directly available. The compensation current $I_{comp}$ is the current flowing through inductor 214 and power supply 216 of bias supply 208 (FIG. 2), and may be directly available, for instance, if there is a sensor configured to measure the compensation current value. If the compensation current value $I_{comp}$ is directly available, the threshold current value $I_{threshold}$ is set in step 1406 to be somewhere between 0 and the negative value of the compensation current $I_{comp}$. In other words, $I_{threshold}$=$w_1$*$I_{comp}$, where $w_1$ is a designer choice value between 0 and −1.

If the compensation current value $I_{comp}$ is not directly available, it is computed in step 1404 as being somewhere between 0 and the negative average value of the output current waveform $i_{out}$ from the reset time $t_{reset}$ ($t_{reset}$=$t_{i-cross2}$) to the end of the period ($t_4$). In other words, $I_{comp}$=−k* (average of $i_{out}$ from $t_{reset}$ to end of period), where k is a designer choice value between 0 and 1. After the compensation current value $I_{comp}$ is computed in step 1404, it is used in step 1406 as described above to compute the threshold current value $I_{threshold}$.

Referring now to FIG. 15, shown is a flowchart depicting a method 1500 for computing the threshold voltage value $V_{threshold}$ in step 1218 of FIG. 12 when using bias supplies having a one-switch, one-supply configuration, such as those depicted in FIGS. 7A and 7B. Step 1502 determines whether the output voltage waveform $V_{out}$ data is DC-coupled or AC-coupled. If the output voltage waveform $V_{out}$ data is AC-coupled, the threshold voltage value $V_{threshold}$ is set in step 1504 to be equal to $V_{supply}$ (the first power supply voltage 216). If the output voltage waveform $V_{out}$ data is DC-coupled, the threshold voltage value $V_{threshold}$ is set in step 1506 to be zero.

Referring now to FIG. 16, shown is a flowchart depicting a method 1600 for computing the threshold voltage value $V_{threshold}$ in step 1218 of FIG. 12 when using bias supplies having a one-switch, two-supply configuration, such as that of FIG. 8. Step 1602 determines whether the output voltage waveform $V_{out}$ data is DC-coupled or AC-coupled. If the output voltage waveform $V_{out}$ data is AC-coupled, the threshold voltage value $V_{threshold}$ is set in step 1604 to be equal to be the sum of $V_{supply}$ (the first power supply voltage 216) and $V_{rail}$ (the second power supply voltage 218). If the output voltage waveform $V_{out}$ data is DC-coupled, the threshold voltage value $V_{threshold}$ is set in step 1606 to be $V_{rail}$ (the second power supply voltage 218).

Figure 17:
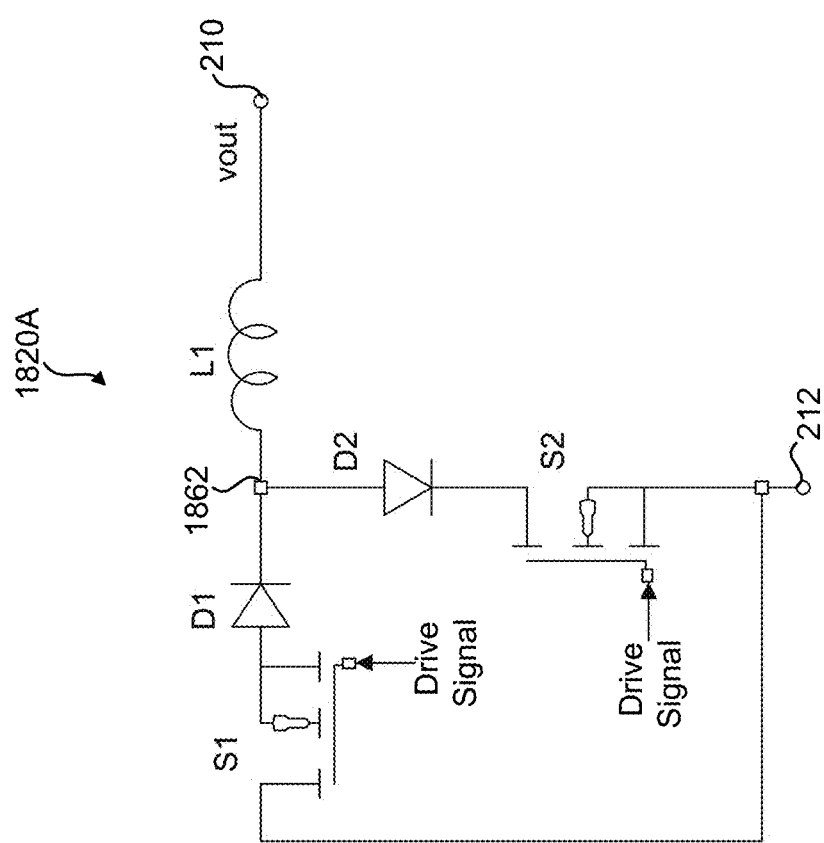
FIG. 17 is a schematic diagram depicting an example of a two-switch network that may be implemented in a bias supply having a one power supply configuration.
Figure 18:
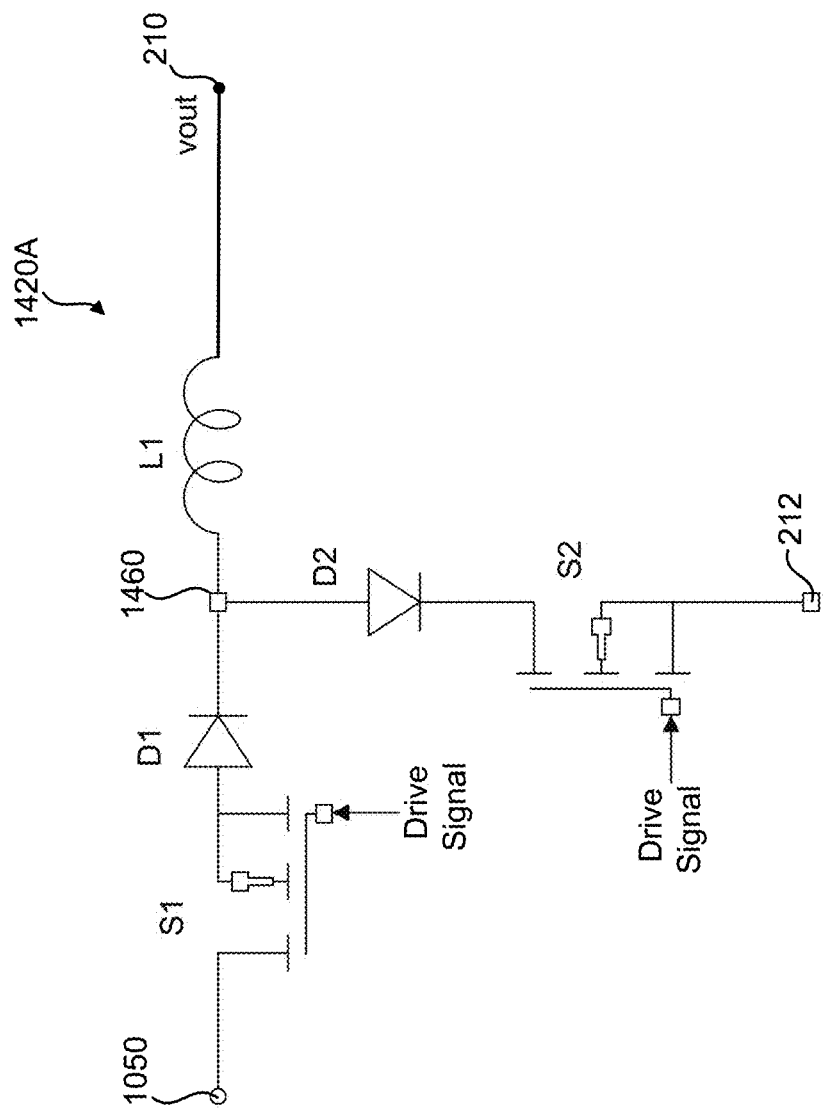
FIG. 18 is a schematic diagram depicting an example of a two-switch network that may be implemented in a bias supply having a two power supply configuration.

Referring next to FIGS. 17 and 18, shown are examples of switch networks having two-switch configurations that may be implemented in switch network 220 of bias supply 208 (FIG. 2). FIG. 17 depicts a two-switch configuration that may be implemented in a one-supply configuration, that is, where the bias supply 208 includes only the first power supply 216 and is controlled by an associated one-supply control system such as that of FIG. 6. FIG. 18 depicts a two-switch configuration that may be implemented in a two-supply configuration, that is, where the bias supply 208 includes the first power supply 216 and the second power supply 218 and is controlled by an associated two-supply control system such as that of FIG. 5.

Referring now to FIG. 17, shown is a schematic drawing depicting a switch network 1820A that is an example of a switch network 220 having two switches S1 and S2, and that may be deployed in conjunction with a one-supply configuration in which the bias supply 208 includes only the first power supply 216 and is controlled by an associated one-supply control system such as that of FIG. 6. In the variation depicted in FIG. 17, a series combination of the first switch S1 and the first diode D1 is arranged between the return node 212 of the bias supply 208 and node 1862. In addition, a series combination of the second switch S2 and the second diode D2 is arranged between the node 1862 and the return node 212 of the bias supply 208. As shown in FIG. 17, the first diode D1 is arranged between the first switch S1 and the node 1862 with its anode coupled to the first switch S1 and its cathode coupled to the node 1862. The second diode D2 is arranged between the second switch S2 and the node 1862 with its cathode coupled to the second switch S2 and its anode coupled to the node 1862. In this arrangement, the cathode of the first diode D1 is coupled to the anode of the second diode D2 at the node 1862.

Referring now to FIG. 18, shown is a schematic drawing depicting a switch network 1420A that is an example of a switch network 220 having two switches S1 and S2, and that may be deployed in conjunction with a two-supply configuration in which the bias supply 208 includes the first power supply 216 and the second power supply 218 and is controlled by an associated two-supply control system such as that of FIG. 5. Switch network 1420A couples to the bias supply 208 at node 1050, the return node 212, and the output node 210. Also shown for reference in the switch network 1420A is node 1460. As depicted, the switch network 1420A comprises a first switch S1 arranged in series with a first diode D1 between node 1050 and node 1460. A cathode of the diode D1 is coupled to the node 1460 and an anode of the diode D1 is coupled to the switch S1. The switch network 1420A also comprises a second switch S2 arranged in series with a second diode D2 between the return node 212 and node 1460. An anode of the diode D2 is coupled to the node 1460 and a cathode of the diode D2 is coupled to the switch S2. In addition, an inductor L1 is positioned between the node 1460 and the output node 210.

In FIGS. 17 and 18, it should be recognized that because the switch S1 and the diode D1 are arranged in series, the order of the switch S1 and the diode D1 may be swapped.

Similarly, because the switch S2 and the diode D2 are arranged in series, the order of the switch S2 and the diode D2 may be swapped.

Figure 19:
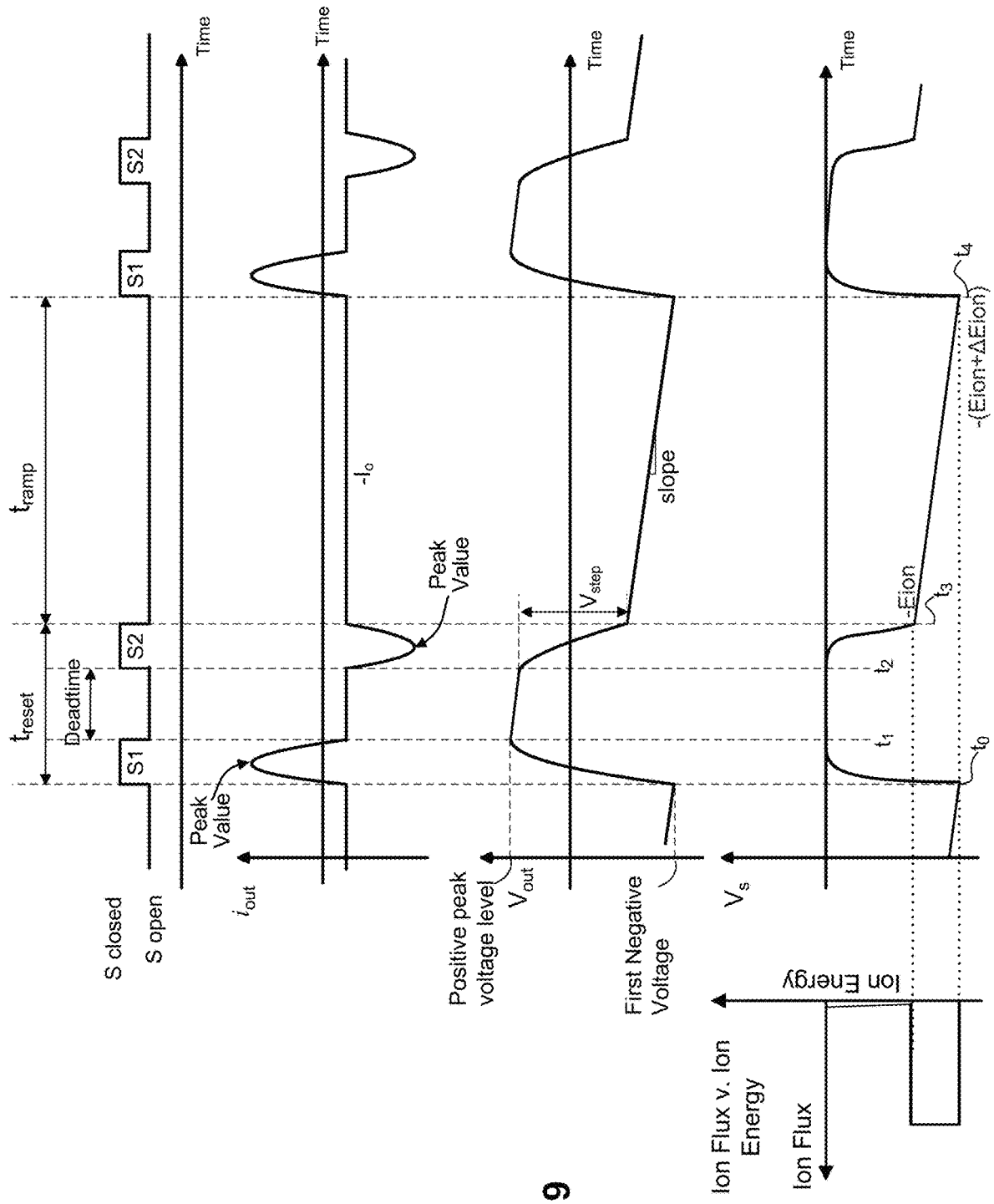
FIG. 19 depicts graphs and a timing diagram illustrating aspects of a bias supply that comprises two switches.

Referring now to FIG. 19, shown are graphs and a timing diagram illustrating aspects of bias supplies that comprise switching networks having two switches S1 and S2, such as the switching networks of FIGS. 17 and 18. The switches S1 and S2 are operated to create the asymmetric periodic voltage and current waveforms $V_{out}$ and $i_{out}$ depicted in FIG. 19. In operation, first diode D1 conducts when the first switch S1 is closed (turned on), and a second diode D2 conducts when the second switch D2 is closed (turned on).

Referring to FIG. 19, the output current waveform $i_{out}$ rises at time $t_0$ (when switch S1 is closed) from a first threshold current value (which may or may not be equal to $I_o$) to a positive peak current value. The output current waveform $i_{out}$ then falls from the positive peak current value to reach the first threshold current level and flattens out. At a time $t_2$ after switch S1 is opened (turned off), switch S2 is closed (turned on) and the output current waveform $i_{out}$ falls to a negative peak current value. The output current waveform $i_{out}$ then rises from the negative peak current value to reach a second threshold current value (which may or may not be equal to $I_o$). The output current waveform $i_{out}$ then gradually flattens out to a slightly negative compensation current $-I_o$ until at time $t_4$ when the cycle ends and S1 is closed again (turned on).

As depicted, the bias supplies 208 disclosed herein operate to apply an asymmetric periodic voltage waveform $V_{out}$ from time $t_0$ to $t_4$ between the output node 210 and the return node 212. As shown, the asymmetric periodic voltage waveform $V_{out}$ includes a first portion from time $t_0$ to $t_1$ that begins at time $t_0$ with a first negative voltage value and rises to a positive peak voltage value at time $t_1$. During a second portion from $t_1$ to $t_3$, the voltage waveform $V_{out}$ has a transition ramp portion during the deadtime from $t_1$ to $t_2$ and then at time $t_2$, falls by an amount $V_{step}$ to a third (negative) voltage value at time $t_3$. A third portion of the voltage waveform $V_{out}$ (from time $t_3$ to $t_4$) includes a voltage ramp between the third voltage level and a fourth, negative voltage level (at time $t_4$)

As shown in FIG. 19, the asymmetric periodic voltage waveform comprises a voltage step $V_{step}$ between times $t_2$ and $t_3$, and $V_{step}$ corresponds to a sheath voltage at $t_3$ that produces ions at any energy level, $-E_{ion}$. During the third portion of the asymmetric periodic voltage waveform, the sheath voltage may become more negative so that at time $t_4$, ions at an energy level of $-(E_{ion}+\Delta_{Eion})$ are produced.

Also shown in FIG. 19 are times $t_{reset}$ (times $t_0$ to $t_3$) and tramp (times $t_3$ and $t_4$). As shown, $t_{reset}$ covers a time that includes both the first and second portions of the asymmetric periodic voltage waveform $V_{out}$, and $t_{ramp}$ includes the third portion of the $V_{out}$ waveform. Also shown in FIG. 19 is the compensation current $I_{comp}$ referenced in FIG. 2. The compensation current $I_{comp}$ may be provided throughout the application of the asymmetric periodic voltage function, and $i_{out}$ may or may not equal $I_{comp}$ during the third portion of the asymmetric periodic voltage waveform (during $t_{ramp}$).

The fundamental period (from $t_0$ to $t_4$) of the asymmetric periodic voltage waveform may be adjusted to adjust a spread of ion energies. As shown in FIG. 19, a full current cycle occurs between times $t_0$ and $t_3$ during the first and second portions of the asymmetric periodic voltage waveform. The time between full current cycles is the time $t_{ramp}$ between $t_3$ and $t_4$.

As shown in FIG. 19, switches S1 and S2 may be controlled with an adjustable deadtime, which is the time from $t_1$ to $t_2$ (after the switch S1 is opened from a closed position and before the switch S2 is closed). The first portion of the voltage waveform $V_{out}$ may transition (during the deadtime between time $t_1$ to $t_2$) in a ramp profile to the second portion of the asymmetric periodic voltage waveform.

Control of the deadtime enables control over the reset time $t_{reset}$ and adjusting a ratio of the reset time $t_{reset}$ to the ramp time $t_{ramp}$ adjusts average power. Control over $t_{reset}$ enables the fundamental switching frequency to be controlled (e.g., to remain below a level that affects plasma density in the plasma processing chamber 101).

Another aspect of control that may be achieved with the bias supply 208 disclosed herein is ion current compensation. More specifically, the length of the deadtime, the length of $t_{ramp}$, and/or the period of the periodic voltage function (between $t_0$ and $t_4$) may be controlled to control a level of ion current compensation. In FIG. 19, $t_{ramp}$, the deadtime, and/or the level of $I_o$ may be controlled (if desired) so that ion current, Iion, is compensated to a point where $I_o=I_{ion}-(Cch+Cstr1)*slope$ and $I_{comp}=I_{ion}-(Cch+Cstr0+Cstr1)*slope$ where slope is the slope of the output voltage, $V_{out}$, from $t_3$ to $t_4$.

As shown in FIG. 19, when overcompensating for ion current, the sheath voltage $V_s$ (and the voltage at the surface of the workpiece 103) becomes increasingly negative between times $t_3$ and $t_4$ (during the $t_{ramp}$ time frame). Due to the range of sheath voltages between $t_3$ and $t_4$, there is a distribution of ion energies. It should be recognized, however, that ion current may be undercompensated so that the sheath voltage $V_s$ (and the voltage at the surface of the workpiece 103) becomes less negative between times $t_3$ and $t_4$ (during the tramp time frame). It is also possible to adjust the slope of the bias output voltage, Vout, between $t_3$ and $t_4$ so that the sheath voltage $V_s$ is substantially constant between $t_3$ and $t_4$, which results in a very narrow distribution of ion energy.

By adjusting both deadtime and $t_{ramp}$, the frequency of the periodic voltage waveform may be fixed if desired, but it is also possible to vary the deadtime, $t_{ramp}$, and the frequency of the periodic voltage waveform. It is also contemplated that the deadtime may be shortened while shortening or lengthening $t_{ramp}$.

Figure 20:
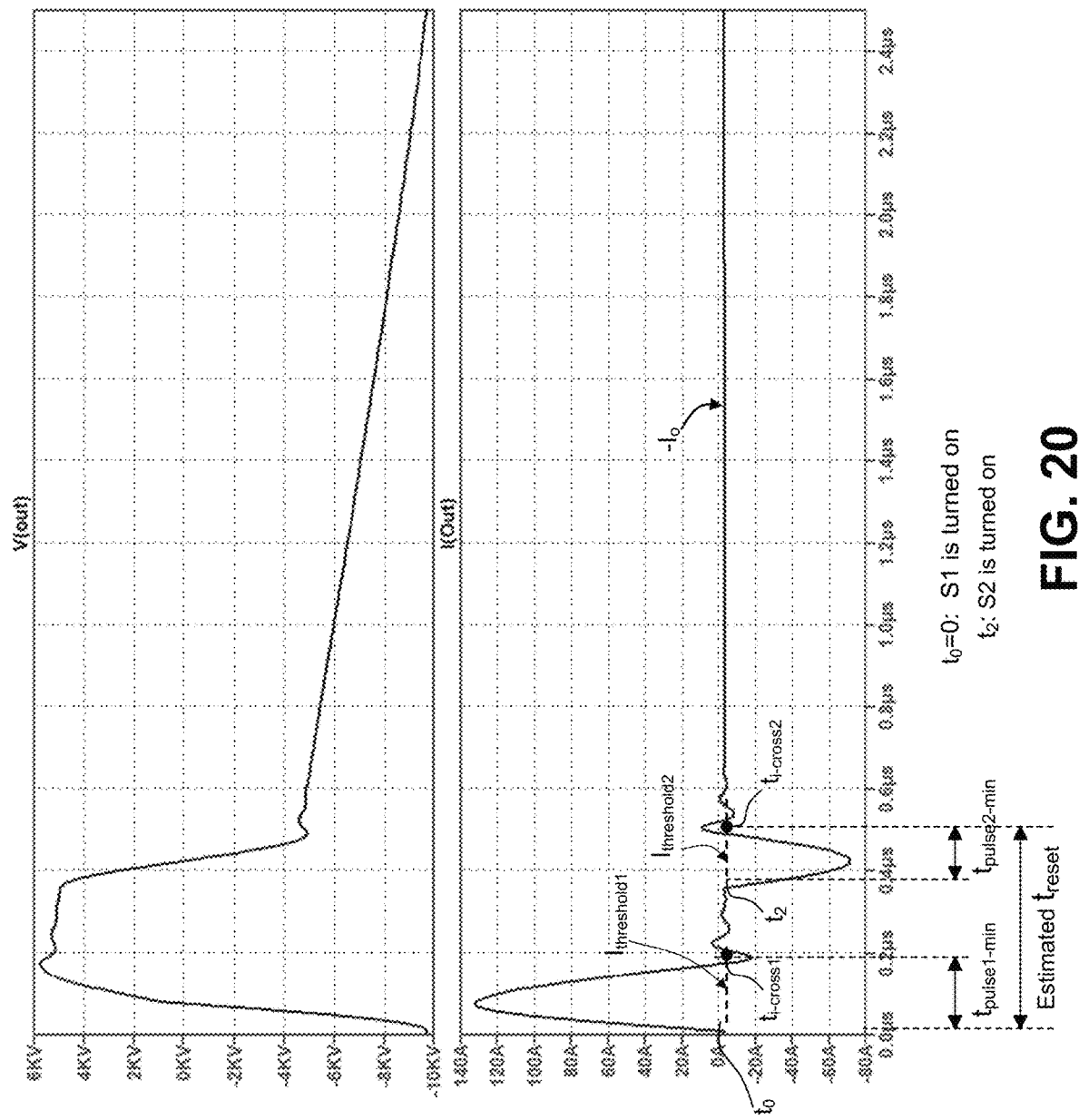
FIG. 20 depicts complete digital representations of one cycle of the asymmetrical periodic output voltage and current waveforms associated with implementations of bias supplies having two switches.
Figure 21:
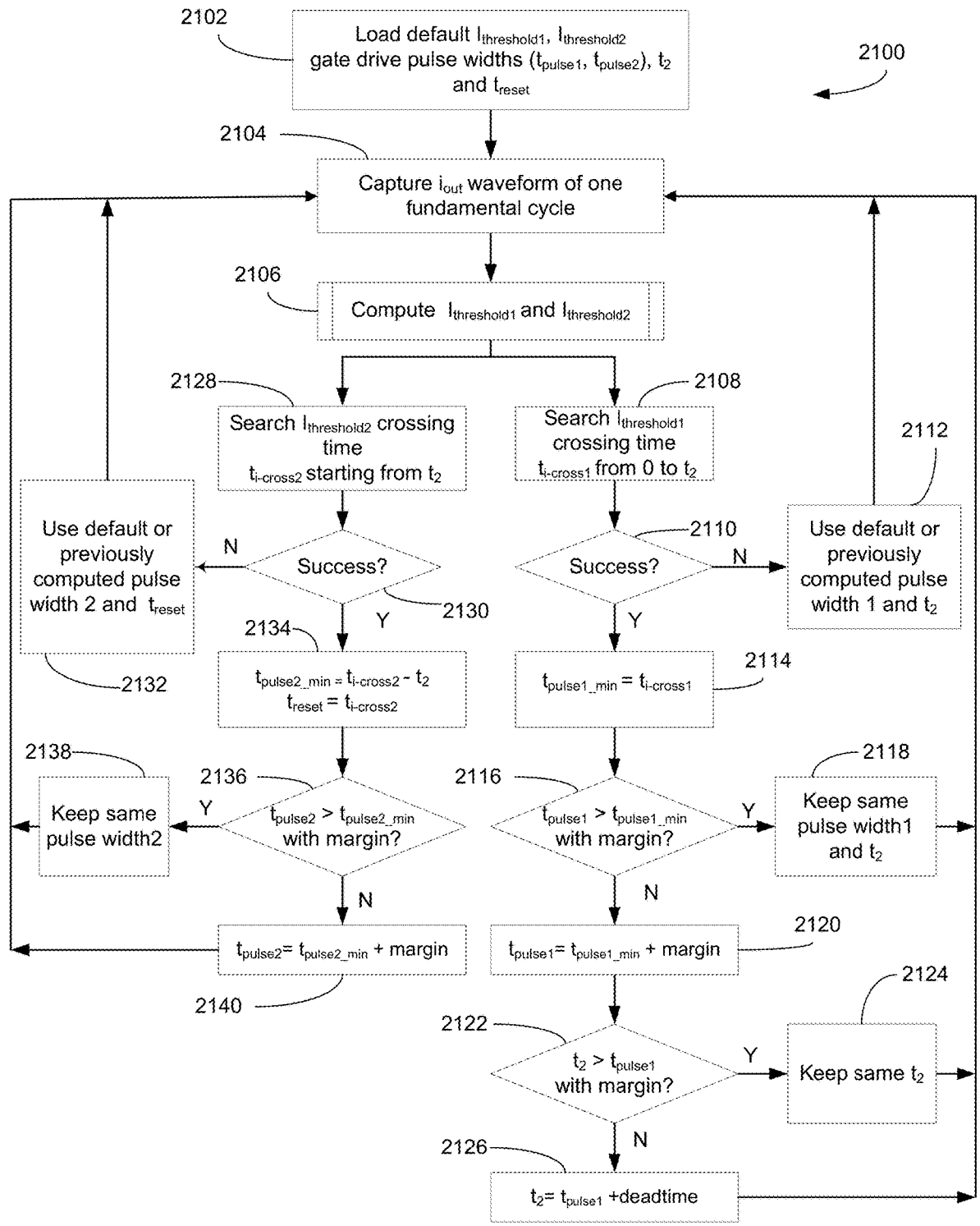
FIG. 21 is a flowchart depicting a method for setting gate drive pulse widths and reset time that may be performed in conjunction with bias supplies having a two-switch network.
Figure 22:
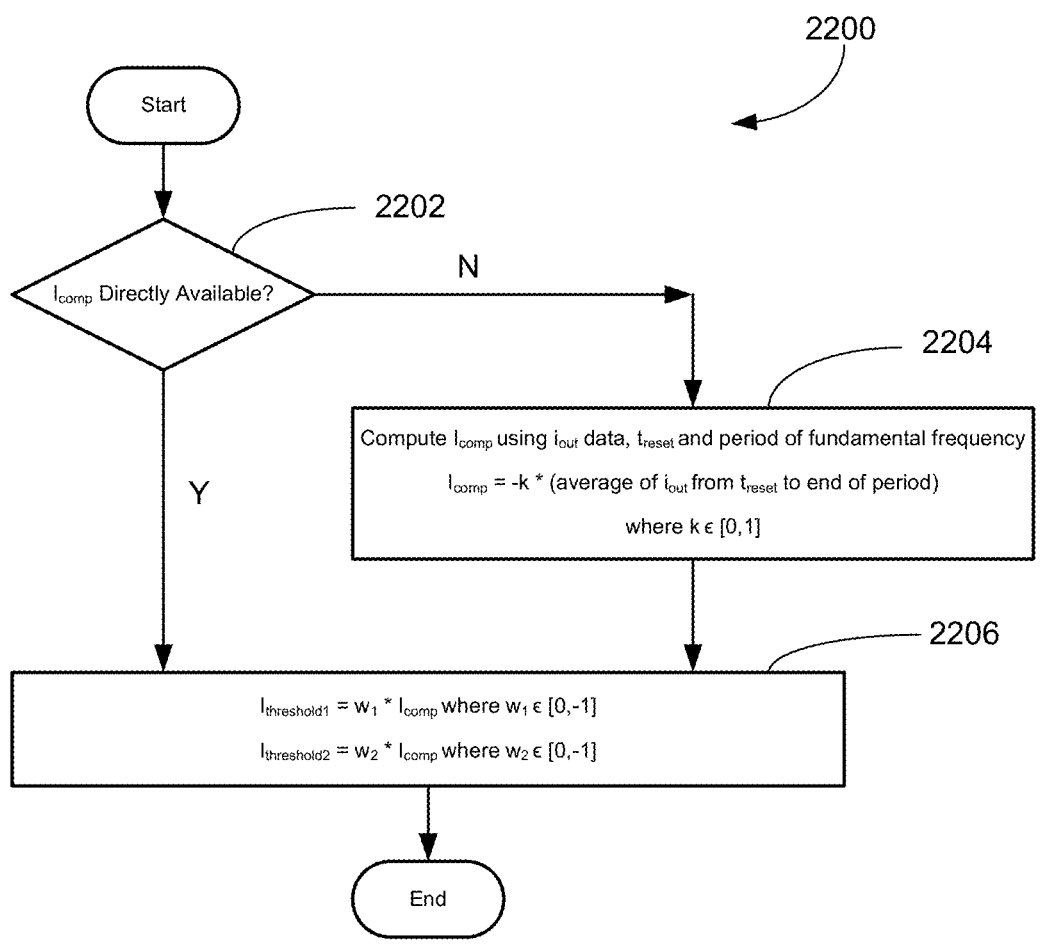
FIG. 22 is a flowchart depicting a method for computing threshold current values in conjunction with bias supplies having a two-switch network.

To control a bias supply having a two-switch network, two gate drive pulse width signals are required: a first pulse width signal to close (turn on) and open (turn off) the first switch S1, and a second pulse width signal to open (turn on) and close (turn off) the second switch S2. The timing parameter estimator 634 may detect when the output current $i_{out}$ reverses (crosses the threshold current value) for a first time and for a second time, and may generate respective pulse width signals to the gate drive signal generator 636 to cause switches S1 and S2 to open (turn off) at or after these times. Once the current reverses direction, current is no longer flowing through the active switch, and it may be safely opened (turned off). The second switch S2 must be opened (turned off) before the reset time $t_{reset}$ so that the voltage output waveform $V_{out}$ takes on the downward ramp profile during time $t_{ramp}$. Therefore, as in the single-switch configuration, there is a range of pulse widths that the pulse widths may fall within. In addition, in a two-switch configuration, the time $t_2$ at which the second switch S2 is closed (turned on) must be computed. There is no need for a computation as to when the first switch S1 is closed (turned on), since it automatically closes (turns on) at time $t_0$ (as in the one-switch configuration). FIGS. 20-22, described below, address computing the gate pulse widths for the first and second switches, the reset time $t_{reset}$, and the close (turn on) time for the second switch.

FIG. 20 is a timing diagram associated with implementations of bias supplies 208 that have two switches and illustrates various timing parameters used by timing parameter estimator 634 in the calculation of the gate drive pulse widths $t_{pulse1}$ and $t_{pulse2}$, the time t2 for turning on the second switch, and the reset time $t_{reset}$. FIG. 20 depicts one cycle of the complete digital representation of the asymmetrical periodic output voltage waveform $V_{out}$, and one cycle of the complete digital representation of asymmetric periodic current waveform $I_{out}$. Timing parameter estimator 634 may receive these representations of the voltage and current waveforms, for example, from metrology section 620. In the following description of FIG. 20, times $t_0$-$t_4$ are as indicated in the timing diagram of FIG. 19.

Referring to FIG. 20, the output current waveform $i_{out}$ rises at time $t_0$ (when switch S1 is closed) from a first threshold current value $I_{threshold1}$ to a positive peak current value. The output current waveform $i_{out}$ then falls from the positive peak current value to cross the first threshold current $I_{threshold1}$ at first threshold current crossing time $t_{i-cross1}$. At a time $t_2$ after switch S1 is opened (turned off), switch S2 is closed (turned on) and the output current waveform $i_{out}$ falls to a negative peak current value. The output current waveform $i_{out}$ then rises from the negative peak current value to cross the second threshold current $I_{threshold2}$ at second threshold current crossing time $t_{i-cross2}$. The output current waveform $i_{out}$ then gradually flattens out to a slightly negative compensation current $-I_{comp}$.

The asymmetric periodic voltage waveform $V_{out}$ of FIG. 20 includes a first portion from time $t_0$ to $t_1$ that begins at time $t_0$ with a first negative voltage value and rises to a positive peak voltage value at time $t_1$. During a second portion from $t_2$ to $t_3$, the voltage waveform $V_{out}$ has a transition ramp portion during the deadtime from $t_1$ to $t_2$ and then at time $t_2$, falls by an amount $V_{step}$ to a third (negative) voltage value at time $t_3$. A third portion of the voltage waveform $V_{out}$ (from time $t_3$ to $t_4$) ramps steadily and negatively between the third voltage level and a fourth, negative voltage level (at time $t_4$).

FIG. 21 is a flowchart depicting a method 2100 performed by timing parameter estimator 634, in conjunction with implementations of bias supplies 208 that have two switches, for computing the gate drive pulse widths $t_{pulse1}$ and $t_{pulse2}$, the time $t_2$ for closing (turning on) the second switch S2, and the reset time $t_{reset}$. Method 2100 may be performed in conjunction with a two-switch, single-supply configuration, such as the configuration of FIG. 17, or in conjunction with a two-switch, two-supply configuration, such as that shown in FIG. 18.

Referring now to FIG. 21, in step 2102, timing parameter estimator 634 loads default first and second threshold current values $I_{threshold1}$ and $I_{threshold2}$, default gate drive pulse widths $t_{pulse1}$ and $t_{pulse2}$, and a default reset time $t_{reset}$. In step 2104, timing parameter estimator 634 captures the output current waveform $i_{out}$ of one fundamental cycle. In one example, for instance, estimator 634 captures one cycle of the complete digital representation of asymmetric periodic current waveform $i_{out}$ that is provided by metrology section 620, as is depicted in FIG. 20. In step 2106, first and second threshold current values $I_{threshold1}$ and $I_{threshold2}$ are computed as shown in FIG. 22.

Following computation of the threshold current values in step 2106, method 2100 proceeds with steps 2108-2126 to compute the first pulse width $t_{pulse1}$ and the time $t_2$ for the start of the second gate drive pulse, and with steps 2128-2140 to comput the second pulse width $t_{pulse2}$. Steps 2108-2126 for computing the first pulse width and the time for turning on the second switch S2 are described first.

In step 2108, timing parameter estimator 634 searches the output current $i_{out}$ waveform from time $t_0$ to time $t_2$ for the time $t_{i-cross1}$ that the output current $i_{out}$ waveform crosses the first threshold current value Ithreshold1. In step 2110, if the first threshold current crossing time $t_{i-cross1}$ is not found, the method proceeds to step 2112 to set the first gate drive pulse width $t_{pulse1}$ as the default pulse width or the previously computed pulse width, and to set the time $t_2$ for start of the second pulse (closing of switch 2) as the default or previously computed time $t_2$. The method 2100 then loops back to step 2104 to capture the next cycle of the asymmetric periodic current waveform $i_{out}$ that is provided by metrology section 620, and the method repeats from there.

In step 2110, if the first threshold current crossing time ti-cross is found, the method proceeds to step 2114. In step 2114, the minimum first pulse width is set to be equal to the first threshold current crossing time ($t_{pulse1\_min} = t_{i-cross1}$). In other words, the minimum width of the first pulse (time during which S1 is closed or turned on) is set to be the total time from $t_0$ that it takes the output current waveform $i_{out}$ to rise to its positive peak current and then fall to the point at which it crosses the first threshold current value $I_{threshold}$ for the first time.

In step 2116, if the current first pulse width $t_{pulse1}$ is greater than the minimum first pulse width $t_{pulse1\_min}$ plus a margin (a design choice value), then the first pulse width $t_{pulse1}$ and time $t_2$ are kept at their current values in step 2118. The method 2100 then loops back to step 2104 to capture the next cycle of the asymmetric periodic current waveform $i_{out}$ that is provided by metrology section 620, and the method repeats from there. In step 2116, if the current first pulse width $t_{pulse1}$ is not greater than the minimum pulse width $t_{pulse1\_min}$ with the margin, the first pulse width $t_{pulse1}$ is set in step 2120 to the minimum first pulse width $t_{pulse1\_min}$ plus the margin ($t_{pulse1} = t_{pulse1\_min} +$margin).

In step 2122, if the time $t_2$ (time for the start of the second pulse to close (turn on) S2) is greater than the first pulse width $t_{pulse1}$ plus the margin, then $t_2$ is kept the same in step 2124. The method 2100 then loops back to step 2104 to capture the next cycle of the asymmetric periodic current waveform $i_{out}$ that is provided by metrology section 620, and the method repeats from there.

In step 2126, if the time $t_2$ is not greater than the first pulse width $t_{pulse1}$ with the margin, then the time $t_2$ is set to be equal to the first pulse width plus the deadtime (time from $t_1$ to $t_2$), i.e., $t_2 = t_{pulse1}$+deadtime. The method 2100 then loops back to step 2104 to capture the next cycle of the asymmetric periodic current waveform $i_{out}$ that is provided by metrology section 620, and the method repeats from there.

Steps 2128-2140 for computing the second pulse width $t_{pulse2}$ are now described. In step 2128, following computation of the first and second threshold current values $I_{threshold1}$ and $I_{threshold2}$ in step 2106, timing parameter estimator 634 searches the output current $I_{out}$ waveform, starting from time $t_2$, for the time $t_{i-cross2}$ that the output current $i_{out}$ waveform crosses the second threshold current value $I_{threshold2}$. In step 2130, if the second threshold current crossing time $t_{i-cross2}$ is not found, the method proceeds to step 2132 to set the second gate drive pulse width $t_{pulse2}$ as the default second pulse width or the previously computed second pulse width, and to set the reset time $t_{reset}$ as the default reset time or previously computed reset time. The method 2100 then loops back to step 2104 to capture the next cycle of the asymmetric periodic current waveform $i_{out}$ that is provided by metrology section 620, and the method repeats from there.

In step 2130, if the second threshold current crossing time $t_{i\text{-}cross2}$ is found, the method proceeds to step 2134. In step 2134, the minimum second pulse width is set to be equal to the second threshold current crossing time minus the time $t_2$ ($t_{pulse2\_min} = t_{i\text{-}cross2} - t_2$). In other words, the minimum width of the second pulse (time during which S2 is closed or turned on) is set to be the total time from $t_2$ that it takes the output current waveform $i_{out}$ to fall to its negative peak current value and then rise to the point at which it crosses the second threshold current value $I_{threshold2}$. In addition, the reset time is set to be equal to the second threshold current crossing time ($t_{reset} = t_{i\text{-}cross2}$).

In step 2136, if the current second pulse width $t_{pulse2}$ is greater than the minimum second pulse width $t_{pulse2\_min}$ with the margin, then the second pulse width $t_{pulse2}$ is kept at its current value in step 2138. The method 2100 then loops back to step 2104 to capture the next cycle of the asymmetric periodic current waveform $i_{out}$ that is provided by metrology section 620, and the method repeats from there.

In step 2136, if the current second pulse width $t_{pulse2}$ is not greater than the minimum second pulse width $t_{pulse2\_min}$ with the margin, the second pulse width is set in step 2140 to the minimum second pulse width $t_{pulse2\_min}$ plus the margin ($t_{pulse2} = t_{pulse2\_min} + $margin). The method 2100 then loops back to step 2104 to capture the next cycle of the asymmetric periodic current waveform $i_{out}$ that is provided by metrology section 620, and the method repeats from there.

FIG. 22 is a flowchart depicting a method 2200 for computing the first and second threshold current values $I_{threshold1}$ and $I_{threshold2}$ in step 2106 of FIG. 21, that is, for computing the first and second threshold current values in conjunction with the two-switch configurations of FIGS. 17 and 18.

Step 2202 determines whether the compensation current $I_{comp}$ is directly available, such as by being directly sensed. The compensation current $I_{comp}$ is the current flowing through inductor 214 and power supply 216 of bias supply 208 (FIG. 2). If the compensation current $I_{comp}$ is directly available, the first threshold current $I_{threshold1}$ is set in step 2206 to be somewhere between 0 and the negative value of the compensation current $I_{comp}$. In other words, $I_{threshold1} = w_1 * I_{comp}$, where $w_1$ is a design choice value between 0 and −1. Likewise, the second threshold current $I_{threshold2}$ is set to be somewhere between 0 and the negative value of the compensation current $I_{comp}$. In other words, $I_{threshold2} = w_2 * I_{comp}$, where $w_2$ is a design choice value between 0 and −1.

If the compensation current $I_{comp}$ is not directly available, it is computed in step 2204 as being somewhere between 0 and the negative average value of the output current waveform $i_{out}$ from the reset time $t_{reset}$ ($t_{reset} = t_{i\text{-}cross2}$) to the end of the period ($t_4$). In other words, $I_{comp} = -k*$(average of $i_{out}$ from $t_{reset}$ to end of period), where k is a design choice value between 0 and 1. After the compensation current $I_{comp}$ is computed in step 2204, it is used in step 2206 as described above to compute the threshold current $I_{threshold}$.

Figure 23:
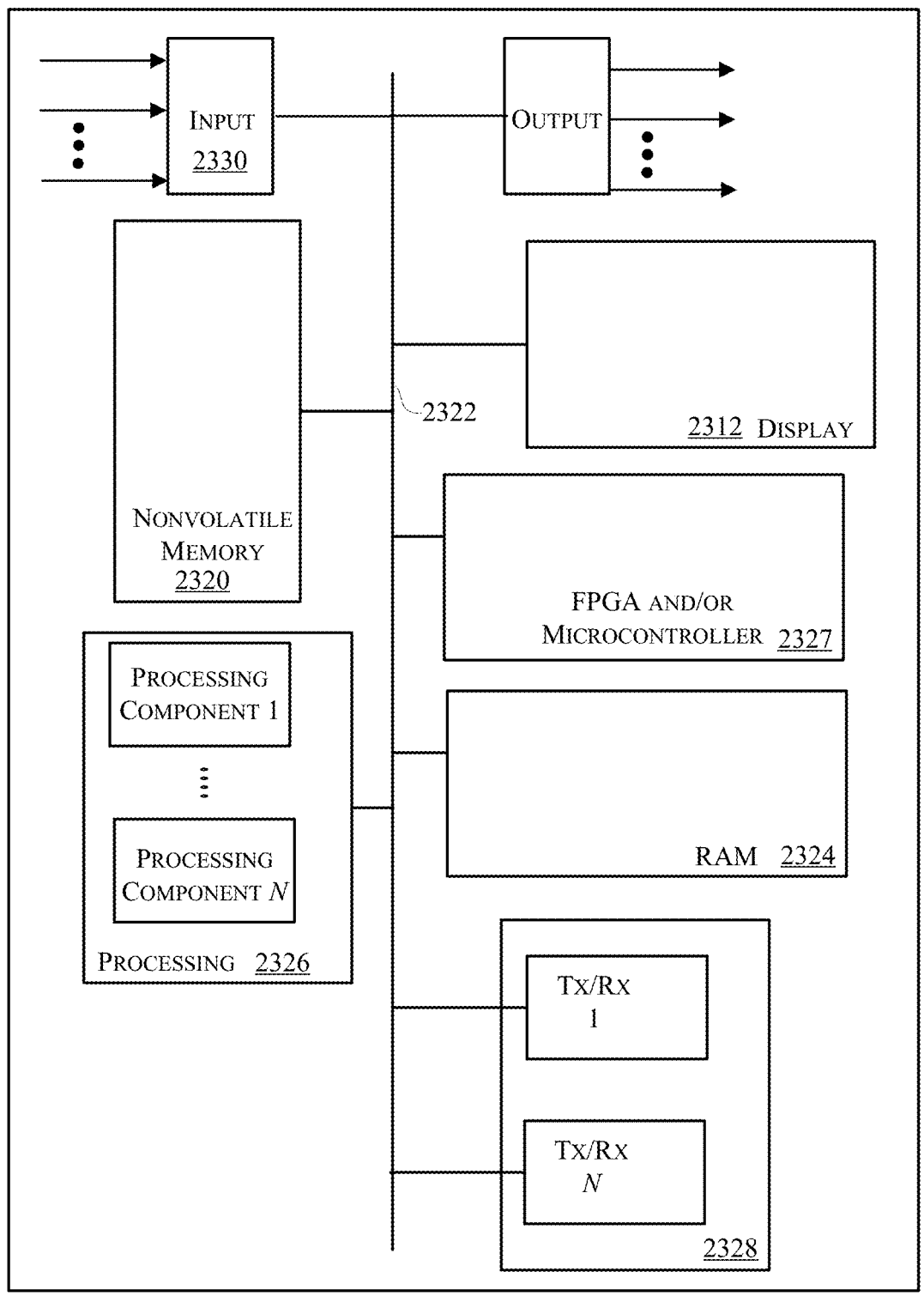
FIG. 23 is a block diagram depicting components that may be utilized to implement control aspects disclosed herein.

The methods described in connection with the embodiments disclosed herein may be embodied directly in hardware, in processor-executable code encoded in a non-transitory tangible processor readable storage medium, or in a combination of the two. Referring to FIG. 23 for example, shown is a block diagram depicting physical components that may be utilized to realize control aspects disclosed herein. As shown, a display 2312 and nonvolatile memory 2320 are coupled to a bus 2322 that is also coupled to random access memory ("RAM") 2324, a processing portion (which includes N processing components) 2326, a field programmable gate array (FPGA) 2327, and a transceiver component 2328 that includes N transceivers. Although the components depicted in FIG. 23 represent physical components, FIG. 23 is not intended to be a detailed hardware diagram; thus, many of the components depicted in FIG. 23 may be realized by common constructs or distributed among additional physical components. Moreover, it is contemplated that other existing and yet-to-be developed physical components and architectures may be utilized to implement the functional components described with reference to FIG. 23.

This display 2312 generally operates to provide a user interface for a user, and in several implementations, the display is realized by a touchscreen display. In general, the nonvolatile memory 2320 is non-transitory memory that functions to store (e.g., persistently store) data and processor-executable code (including executable code that is associated with effectuating the methods described herein). In some embodiments for example, the nonvolatile memory 2320 includes bootloader code, operating system code, file system code, and non-transitory processor-executable code to facilitate the execution of a method of controlling a switch network of a bias supply. In some implementations, the timing parameter estimator 634 may be realized (at least in part) by a processor executing instructions that may be stored as processor-executable code in the nonvolatile memory 2330.

In many implementations, the nonvolatile memory 2320 is realized by flash memory (e.g., NAND or ONENAND memory), but it is contemplated that other memory types may be utilized as well. Although it may be possible to execute the code from the nonvolatile memory 2320, the executable code in the nonvolatile memory is typically loaded into RAM 2324 and executed by one or more of the N processing components in the processing portion 2326.

The N processing components in connection with RAM 2324 generally operate to execute the instructions stored in nonvolatile memory 2320 to enable execution of the algorithms and functions disclosed herein. It should be recognized that several algorithms are disclosed herein, but some of these algorithms are not represented in flowcharts. Processor-executable code to effectuate methods described herein may be persistently stored in nonvolatile memory 2320 and executed by the N processing components in connection with RAM 2324. As one of ordinarily skill in the art will appreciate, the processing portion 2326 may include a video processor, digital signal processor (DSP), microcontroller, graphics processing unit (GPU), or other hardware processing components or combinations of hardware and software processing components (e.g., an FPGA or an FPGA including digital logic processing portions).

In addition, or in the alternative, non-transitory FPGA-configuration-instructions may be persistently stored in nonvolatile memory 2320 and accessed (e.g., during boot up) to configure a field programmable gate array (FPGA) to implement the algorithms disclosed herein.

The input component 2330 may receive signals (e.g., signals indicative of current and voltage obtained at the output of the disclosed bias supplies). In addition, the input component 2330 may receive phase information and/or a synchronization signal between bias supplies 108 and source generator 112 that are indicative of one or more aspects of an environment within a plasma processing chamber 101 and/or synchronized control between a source generator and the single switch bias supply. The signals received at the input component may include, for example, synchronization signals, power control signals to the various generators and power supply units, or control signals from a user interface. Those of ordinary skill in the art will readily appreciate that any of a variety of types of sensors such as, without limitation, directional couplers and voltage-current (VI) sensors, may be used to sample power parameters, such as voltage and current, and that the signals indicative of the power parameters may be generated in the analog domain and converted to the digital domain.

As one of ordinary skill in the art will appreciate in view of this disclosure, the output component may operates to provide one or more analog or digital signals to effectuate (at least in part) the opening and closing of the switches S1 and S2. The output component may also control of the voltage sources described herein.

The depicted transceiver component 2328 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

As used herein, the recitation of "at least one of A, B or C" or "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A bias supply to apply a periodic voltage comprising:
   a switch network and at least one power supply configured, in combination, to apply an asymmetric periodic voltage waveform and a current waveform;
   a timing parameter estimator configured to generate a pulse width control signal based on a first crossing time that the current waveform crosses a threshold current value after falling from a positive peak current value; and
   a gate drive signal generator configured to, responsive to the pulse width control signal received from the timing parameter estimator, provide a gate drive signal to at least one switch of the switch network to control application of the asymmetric periodic voltage waveform.

2. The bias supply of claim 1, wherein the switch network comprises a single switch.

3. The bias supply of claim 2, wherein the timing parameter estimator:
   determines a minimum pulse width to be the first crossing time that the current waveform crosses the threshold current value.

4. The bias supply of claim 3, wherein the timing parameter estimator:
   determines a second crossing time that the current waveform crosses a threshold value after rising from a negative peak current value;
   determines a maximum pulse width to be midway between the first crossing time and the second crossing time; and
   controls the pulse width control signal to be between the minimum pulse width and the maximum pulse width.

5. The bias supply of claim 4, wherein the bias supply has either one power supply or two power supplies.

6. The bias supply of claim 4, further comprising an inductor in series within the at least one power supply such that a compensation current flows through the inductor, wherein the threshold current value is determined from the compensation current.

7. The bias supply of claim 6, wherein the timing parameter estimator:
   determines the threshold current value to be a negative percentage of the compensation current if the compensation current is directly available; and
   if the compensation current is not directly available, determines the compensation current to be a negative average value of the current waveform from the second crossing time until an end of a full cycle and determines the threshold current value to be a negative percentage of the determined compensation current.

8. The bias supply of claim 3, wherein the timing parameter estimator is configured to:
   determine a maximum pulse width to be a voltage threshold crossing time that the asymmetric periodic voltage waveform crosses a threshold voltage value after falling from a positive peak voltage value; and
   control the pulse width control signal to be between the minimum pulse width and the maximum pulse width.

9. The bias supply of claim 8, wherein:
   the bias supply comprises a single power source having a voltage $V_{supply}$;
   the timing parameter estimator determines the threshold voltage value to be $V_{supply}$ if the asymmetric periodic voltage waveform is AC-coupled; and
   the timing parameter estimator determines the threshold voltage value to be zero if the asymmetric periodic voltage waveform is DC-coupled.

10. The bias supply of claim 8, wherein:
    the bias supply comprises a first power source having a voltage $V_{supply}$ and a second power source having a voltage $V_{rail}$;
    the timing parameter estimator is configured to determine the threshold voltage value to be a sum of $V_{supply}$ and $V_{rail}$ if the asymmetric periodic voltage waveform is AC-coupled; and
    the timing parameter estimator is configured to determine the threshold voltage value to be $V_{rail}$ if the asymmetric periodic voltage waveform is DC-coupled.

11. The bias supply of claim 3, wherein the timing parameter estimator is configured to:
    determine a second crossing time that the current waveform crosses a threshold value after rising from a negative peak current value;

determine a maximum pulse width to be the second crossing time; and control the pulse width control signal to be between the minimum pulse width and the maximum pulse width.

12. The bias supply of claim 11, wherein the bias supply has a single power source.

13. The bias supply of claim 1, wherein the switch network comprises two switches.

14. The bias supply of claim 13, wherein:
the current waveform rises at time $t_0$ to the positive peak current value; falls from the positive peak current value to cross a first threshold current value at a first threshold current crossing time; has a relatively flat profile during a deadtime from the first threshold current crossing time and a time $t_2$; begins falling to a negative peak current value at time t2; and rises from the negative peak current value to cross a second threshold current value at a second threshold current crossing time; and the timing parameter estimator is configured to determine a minimum first pulse width for controlling a first switch of the switch network to be the first threshold current crossing time, and controls a first pulse width control signal for controlling the first switch to be at least the minimum first pulse width plus a predetermined margin.

15. A bias supply to apply a periodic voltage comprising:
a switch network and at least one power supply configured, in combination, to apply an asymmetric periodic voltage waveform and a current waveform; and
a processor and non-volatile memory, the non-volatile memory comprising non-transient, processor executable instructions, the instructions comprising instructions to:
generate a pulse width control signal based on a first crossing time that the current waveform crosses a threshold current value after falling from a positive peak current value; and
a gate drive signal generator configured to, responsive to the pulse width control signal, provide a gate drive signal to at least one switch of the switch network to control application of the asymmetric periodic voltage waveform.

16. The bias supply of claim 15, wherein the instructions comprise instructions for determining a minimum pulse width to be the first crossing time that the current waveform crosses the threshold current value.

17. The bias supply of claim 16, wherein the instructions comprise instructions for:
determining a second crossing time that the current waveform crosses a threshold value after rising from a negative peak current value;
determining a maximum pulse width to be midway between the first crossing time and the second crossing time; and
controlling the pulse width control signal to be between the minimum pulse width and the maximum pulse width.

18. The bias supply of claim 16, wherein the instructions comprise instructions for:
determining a maximum pulse width to be a voltage threshold crossing time that the asymmetric periodic voltage waveform crosses a threshold voltage value after falling from a positive peak voltage value; and
controlling the pulse width control signal to be between the minimum pulse width and the maximum pulse width.

19. The bias supply of claim 16, wherein the instructions comprise instructions for:
determining a second crossing time that the current waveform crosses a threshold value after rising from a negative peak current value;
determining a maximum pulse width to be the second crossing time; and
controlling the pulse width control signal to be between the minimum pulse width and the maximum pulse width.

20. The bias supply of claim 16, wherein the current waveform rises at time to to the positive peak current value; falls from the positive peak current value to cross a first threshold current value at a first threshold current crossing time; has a relatively flat profile during a deadtime from the first threshold current crossing time and a time $t_2$; begins falling to a negative peak current value at time $t_2$; and rises from the negative peak current value to cross a second threshold current value at a second threshold current crossing time, and wherein the instructions comprise instructions for:
determining a minimum first pulse width for controlling a first switch of the switch network to be the first threshold current crossing time, and controlling a first pulse width control signal for controlling the first switch to be at least the minimum first pulse width plus a predetermined margin.

\* \* \* \* \*